United States Patent
Harada

(10) Patent No.: US 10,210,938 B2
(45) Date of Patent: Feb. 19, 2019

(54) SEMICONDUCTOR MEMORY DEVICE

(71) Applicant: Toshiba Memory Corporation, Tokyo (JP)

(72) Inventor: Yoshikazu Harada, Kawasaki Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/449,856

(22) Filed: Mar. 3, 2017

(65) Prior Publication Data

US 2018/0068727 A1 Mar. 8, 2018

(30) Foreign Application Priority Data

Sep. 7, 2016 (JP) ................................. 2016-174663

(51) Int. Cl.
| | |
|---|---|
| *G11C 16/10* | (2006.01) |
| *G11C 16/34* | (2006.01) |
| *G11C 11/56* | (2006.01) |
| G11C 16/04 | (2006.01) |

(52) U.S. Cl.
CPC .......... *G11C 16/10* (2013.01); *G11C 11/5628* (2013.01); *G11C 16/3459* (2013.01); *G11C 16/0483* (2013.01)

(58) Field of Classification Search
CPC ................................................ G11C 11/5628
USPC .................................................. 365/185.03
See application file for complete search history.

(56) References Cited

U.S. PATENT DOCUMENTS

| | | | |
|---|---|---|---|
| 7,936,004 B2 | 5/2011 | Kito et al. | |
| 8,391,062 B2 | 3/2013 | Jang | |
| 8,565,021 B2* | 10/2013 | Lee ..................... | G11C 11/5628 365/185.03 |
| 2010/0195388 A1* | 8/2010 | Jung ................... | G11C 11/5628 365/185.03 |
| 2011/0194346 A1* | 8/2011 | Yoon .................. | G11C 16/3454 365/185.03 |
| 2013/0031430 A1* | 1/2013 | Sharon ................ | G06F 11/1048 714/719 |
| 2013/0155769 A1* | 6/2013 | Li ....................... | G11C 11/5628 365/185.03 |
| 2015/0347314 A1* | 12/2015 | Lee ..................... | G06F 12/1009 711/103 |

(Continued)

FOREIGN PATENT DOCUMENTS

JP 2015-212992 A 11/2015

*Primary Examiner* — Min Huang
(74) *Attorney, Agent, or Firm* — Kim & Stewart LLP

(57) ABSTRACT

A semiconductor memory device includes a plurality of memory cells, and a control circuit configured perform a multi-bit write operation on the memory cells in response to sequentially received commands including a first command and a second command, which is received after the first command, the first command including first bits to be written respectively in the memory cells and the second command including second bits to be written respectively in the memory cells. The multi-bit write operation includes at least a first write operation including at least one program operation that is initiated after receipt of the first command and prior to the receipt of the second command, and a second write operation that is initiated after receipt of the second command.

19 Claims, 32 Drawing Sheets

(56) References Cited

U.S. PATENT DOCUMENTS

2016/0027504 A1\* 1/2016 Lee .................... G11C 11/5635
365/185.03

\* cited by examiner

FIG. 6A

| THRESHOLD VOLTAGE | Er | A | B | C | D | E | F | G |
|---|---|---|---|---|---|---|---|---|
| APPARENT THRESHOLD VOLTAGE | Er OR E TO G | A~D | | | | Er OR E TO G | | |
| LOWER DATA | 1 | 0 | 0 | 0 | 0 | 1 | 1 | 1 |

FIG. 6B

| THRESHOLD VOLTAGE | Er | A | B | C | D | E | F | G |
|---|---|---|---|---|---|---|---|---|
| APPARENT THRESHOLD VOLTAGE | Er OR E | A OR D | B OR C | B OR C | A OR D | Er OR E | F OR G | F OR G |
| MIDDLE DATA | 1 | 1 | 0 | 0 | 0 | 1 | 1 | 0 |
| LOWER DATA | 1 | 0 | 0 | 0 | 0 | 0 | 1 | 1 |

FIG. 19

| TARGET THRESHOLD VOLTAGE LEVEL | Er | A | B | C | D | E | F | G |
|---|---|---|---|---|---|---|---|---|
| APPARENT TARGET THRESHOLD VOLTAGE LEVEL | Er | A | A | A | A | Er | Er | Er |
| SDL | 1 | 0 | 0 | 0 | 0 | 1 | 1 | 1 |
| ADL | 1 | 0 | 0 | 0 | 0 | 1 | 1 | 1 |
| BDL | NA | NA | NA | NA | NA | NA | NA | NA |
| CDL | NA | NA | NA | NA | NA | NA | NA | NA |

FIG. 20

| TARGET THRESHOLD VOLTAGE LEVEL | Er | A | B | C | D | E | F | G |
|---|---|---|---|---|---|---|---|---|
| APPARENT TARGET THRESHOLD VOLTAGE LEVEL | Er | A | A | A | A | Er | Er | Er |
| SDL | 1 | 0 | 0→1 | 0 | 0→1 | 1 | 1 | 1 |
| ADL | 1 | 0 | 0 | 0 | 0 | 1 | 1 | 1 |
| BDL | NA | NA | NA | NA | NA | NA | NA | NA |
| CDL | NA | NA | NA | NA | NA | NA | NA | NA |

FIG. 21

| TARGET THRESHOLD VOLTAGE LEVEL | Er | A | B | C | D | E | F | G |
|---|---|---|---|---|---|---|---|---|
| APPARENT TARGET THRESHOLD VOLTAGE LEVEL | Er | A | B | B | A | Er | F | F |
| SDL | 1 | 0 | 1→0 | 0 | 1 | 1 | 1→0 | 1→0 |
| ADL | 1 | 0 | 0 | 0 | 0 | 1 | 1 | 1 |
| BDL | 1 | 1 | 0 | 0 | 1 | 1 | 0 | 0 |
| CDL | NA | NA | NA | NA | NA | NA | NA | NA |

FIG. 22

| TARGET THRESHOLD VOLTAGE LEVEL | Er | A | B | C | D | E | F | G |
|---|---|---|---|---|---|---|---|---|
| APPARENT TARGET THRESHOLD VOLTAGE LEVEL | Er | A | B | B | A | Er | F | F |
| SDL | 1 | 0→1 | 0 | 0→1 | 1 | 1 | 0 | 0 |
| ADL | 1 | 0 | 0 | 0 | 0 | 1 | 1 | 1 |
| BDL | 1 | 1 | 0 | 0 | 1 | 1 | 0 | 0 |
| CDL | NA | NA | NA | NA | NA | NA | NA | NA |

FIG. 23

| TARGET THRESHOLD VOLTAGE LEVEL | Er | A | B | C | D | E | F | G |
|---|---|---|---|---|---|---|---|---|
| APPARENT TARGET THRESHOLD VOLTAGE LEVEL | Er | Er | B | C | D | E | F | G |
| SDL | 1 | 1 | 0 | 1→0 | 1→0 | 1→0 | 0 | 0 |
| ADL | 1 | 0→1 | 0 | 0 | 0 | 1 | 1 | 1 |
| BDL | 1 | 1 | 0 | 0 | 1 | 1 | 0 | 0 |
| CDL | 1 | 1 | 1 | 0 | 0 | 0 | 0 | 1 |

FIG. 28

| TARGET THRESHOLD VALUE LEVEL | Er | A | B | C | D | E | F | G |
|---|---|---|---|---|---|---|---|---|
| APPARENT TARGET THRESHOLD VOLTAGE LEVEL | Er | A | A | A | A | Er | Er | Er |
| SDL (CASE OF PROGRAMMING OPERATION FOR "A" LEVEL) | 1 | 0 | 0 | 0 | 0 | 1 | 1 | 1 |
| ADL | 1 | 0 | 0 | 0 | 0 | 1 | 1 | 1 |
| BDL | NA | NA | NA | NA | NA | NA | NA | NA |
| CDL | NA | NA | NA | NA | NA | NA | NA | NA |

FIG. 29

| TARGET THRESHOLD VOLTAGE LEVEL | Er | A | B | C | D | E | F | G |
|---|---|---|---|---|---|---|---|---|
| APPARENT TARGET THRESHOLD VOLTAGE LEVEL | Er | A | B | B | A | Er | F | F |
| SDL (CASE OF PROGRAMMING OPERATION FOR "F" LEVEL) | 1 | 1 | 1 | 1 | 1 | 1 | 0 | 0 |
| SDL (CASE OF PROGRAMMING OPERATION FOR "B" LEVEL) | 1 | 0 | 0 | 0 | 1 | 1 | 1 | 1 |
| ADL | 1 | 1 | 0 | 0 | 0 | 1 | 1 | 1 |
| BDL | 1 | NA | 0 | 0 | 1 | 1 | 0 | 0 |
| CDL | NA | NA | NA | NA | NA | NA | NA | NA |

FIG. 30

| TARGET THRESHOLD VALUE LEVEL | Er | A | B | C | D | E | F | G |
|---|---|---|---|---|---|---|---|---|
| SDL (CASE OF PROGRAMMING OPERATION FOR "D" LEVEL) | 1 | 1 | 1 | 1 | 0 | 0 | 1 | 1 |
| SDL (CASE OF TRANSITION TO NORMAL WRITE OPERATION) | 1 | 0 | 0 | 0 | 0 | 0 | 0 | 0 |
| ADL | 1 | 0 | 0 | 0 | 0 | 1 | 1 | 1 |
| BDL | 1 | 1 | 1 | 0 | 1 | 0 | 0 | 0 |
| CDL | 1 | 1 | 0 | 0 | 0 | 0 | 0 | 1 |

FIG. 35

| | I/O0 | I/O1 | I/O2 | I/O3 | I/O4 | I/O5 | I/O6 | I/O7 |
|---|---|---|---|---|---|---|---|---|
| B0 | WRITE OPERATION SETTING INFORMATION START OF WRITING AFTER INPUT OF ALL PIECES OF DATA:0 START OF WRITING WITH ONLY PRECEDENTLY INPUT DATA:1 | | | UNUSED | | | | |
| B1 | | UNUSED | | | | | | |
| B2 | | UNUSED | | | | | | |
| B3 | | UNUSED | | | | | | |

SEMICONDUCTOR MEMORY DEVICE

CROSS-REFERENCE TO RELATED APPLICATION

This application is based upon and claims the benefit of priority from Japanese Patent Application No. 2016-174663, filed Sep. 7, 2016, the entire contents of which are incorporated herein by reference.

FIELD

Embodiments described herein relate generally to a semiconductor memory device.

BACKGROUND

A NAND flash memory in which memory cells are three-dimensionally stacked is known as a semiconductor memory device.

DESCRIPTION OF THE DRAWINGS

FIGS. 6A and 6B are tables illustrating a relationship between a target threshold voltage level and data stored in a target memory cell of the semiconductor memory device according to the first embodiment.

FIGS. 19-23 are tables illustrating the operation of a latch circuit in the write operation of the semiconductor memory device according to the first embodiment.

FIGS. 28-30 are tables illustrating the operation of a latch circuit in the write operation of the semiconductor memory device according to the second embodiment.

FIG. 35 is a table illustrating the set feature operation of the semiconductor memory device according to the modification example.

DETAILED DESCRIPTION

Figure 1:
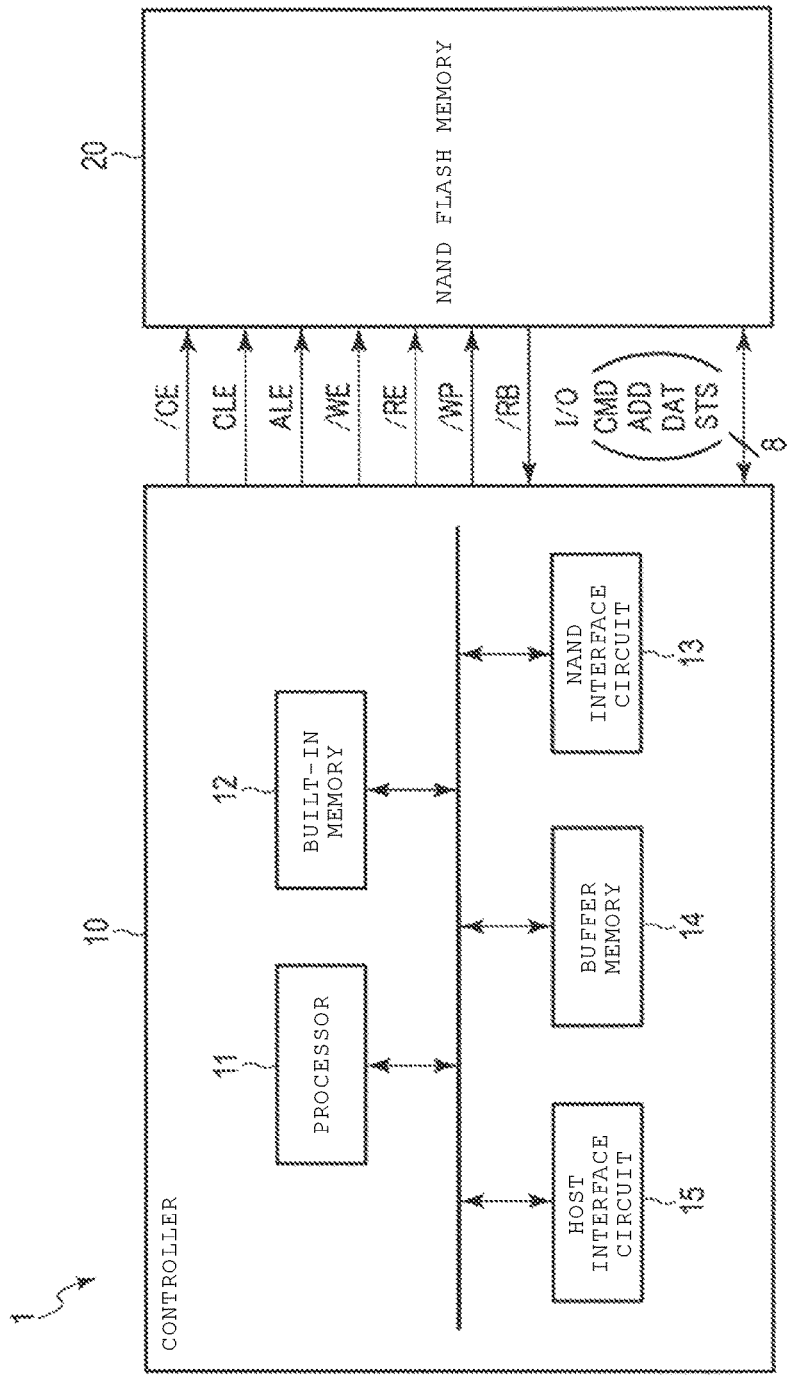
FIG. 1 is a block diagram illustrating a configuration of a memory system according to a first embodiment.

Embodiments reduce a time required for a write operation in a semiconductor memory device.

In general, according to one embodiment, a semiconductor memory device includes a plurality of memory cells, and a control circuit configured perform a multi-bit write operation on the memory cells in response to sequentially received commands including a first command and a second command, which is received after the first command, the first command including first bits to be written respectively in the memory cells and the second command including second bits to be written respectively in the memory cells. The multi-bit write operation includes at least a first write operation including at least one program operation that is initiated after receipt of the first command and prior to the receipt of the second command, and a second write operation that is initiated after receipt of the second command.

Hereinafter, embodiments will be described with reference to the accompanying drawings. Meanwhile, in the following description, components having the same function and configuration will be denoted by common reference numerals and signs. In addition, when a plurality of components having common reference numerals and signs are to be distinguished from each other, they are distinguished by attaching a suffix to common reference numerals and signs. Meanwhile, when a plurality of components do not need to be distinguished from each other, the common reference numerals and signs are used without the subscript.

1. First Embodiment

A semiconductor memory device and a memory system according to a first embodiment will be described.

Hereinafter, a three-dimensionally stacked NAND flash memory in which memory cells are three-dimensionally stacked on a semiconductor substrate will be described as an example of the semiconductor memory device.

1.1 With Regard to Configuration 1.1.1 With Regard to Overall Configuration of Memory System An example of a configuration of the memory system according to the first embodiment will be described with reference to FIG. 1. FIG. 1 is a block diagram illustrating an example of a configuration of the memory system according to the first embodiment. A memory system 1 communicates with, for example, an external host device (not shown). The memory system 1 holds data received from a host device, and reads out the data to the host device.

As illustrated in FIG. 1, the memory system 1 includes a controller 10 and a semiconductor memory device (e.g., NAND flash memory) 20. The controller 10 receives a command from the host device, and controls the semiconductor memory device based on the received command. Specifically, the controller 10 writes data for which an instruction for the writing thereof is given from the host device, in the semiconductor memory device 20, reads out the data for which an instruction for the reading thereof is given from the host device, from the semiconductor memory device 20, and transmits the read data to the host device. The controller 10 is connected to the semiconductor memory device 20 by a NAND bus. The semiconductor memory device 20 includes a plurality of memory cells, and stores data in a non-volatile manner.

The NAND bus performs transmission and reception of signals /CE, CLE, ALE, /WE, /RE, /WP, /RB, and I/O through a NAND interface. The signal /CE is a signal for setting the semiconductor memory device 20 to be in an enabled state. The signals CLE and ALE notify the semiconductor memory device 20 that the signals I/O flowing to the semiconductor memory device 20 in parallel with the signals CLE and ALE are a command CMD and an address ADD, respectively. In addition, when both the signals CLE and ALE are, for example, at a "low (L)" level, the signals notify the semiconductor memory device 20 that the signal I/O flowing to the semiconductor memory device 20 in parallel with the signals CLE and ALE is data DAT. The signal /WE instructs that the signal I/O flowing to the semiconductor memory device 20 in parallel with the signal /WE is fetched in the semiconductor memory device 20. The signal /RE instructs the semiconductor memory device 20 to output the signal I/O. The signal /WP instructs the semiconductor memory device 20 to prohibit the writing and erasing of data. The signal /RB indicates whether the semiconductor memory device 20 is in a ready state (state where a command can be received from the outside) or in a busy state (state where a command cannot be received from the outside). The signal I/O is, for example, a signal of eight bits. The signal I/O is the substance of data which is transmitted and received between the semiconductor memory device 20 and the controller 10, and includes a command CMD, an address ADD, data DAT, and a status STS. The data DAT includes write data and read data.

1.1.2 With Regard to Configuration of Controller

Subsequently, a controller of the memory system according to the first embodiment will be described with reference to FIG. 1. The controller 10 includes a processor (e.g., central processing unit: CPU) 11, a built-in memory (e.g., random access memory: RAM) 12, a NAND interface circuit 13, a buffer memory 14, and a host interface circuit 15.

The processor 11 controls the overall operation of the controller 10. The processor 11 issues a write command through the NAND interface to the semiconductor memory device 20 in response to a write command of data received from, for example, the host device. Reading and erasing are carried out using a similar flow.

The built-in memory 12 is a semiconductor memory such as a dynamic RAM (DRAM), and is used as a work area of the processor 11. The built-in memory 12 holds firmware for managing the semiconductor memory device 20, various types of management tables, and the like.

The NAND interface circuit 13 is connected to the semiconductor memory device 20 through a NAND bus to communicate with the semiconductor memory device 20. The NAND interface circuit 13 transmits the command CMD, the address ADD, and the write data to the semiconductor memory device 20 in response to an instruction of the processor 11. In addition, the NAND interface circuit 13 receives the status STS, and the read data from the semiconductor memory device 20.

The buffer memory 14 temporarily holds data received from the semiconductor memory device 20 and the host device by the controller 10, and the like.

The host interface circuit 15 is connected to the host device to communicate with the host device. The host interface circuit 15 transmits a command and data which are received from, for example, the host device to the processor 11 and the buffer memory 14, respectively.

1.1.3 With Regard to Configuration of Semiconductor Memory Device

Figure 2:
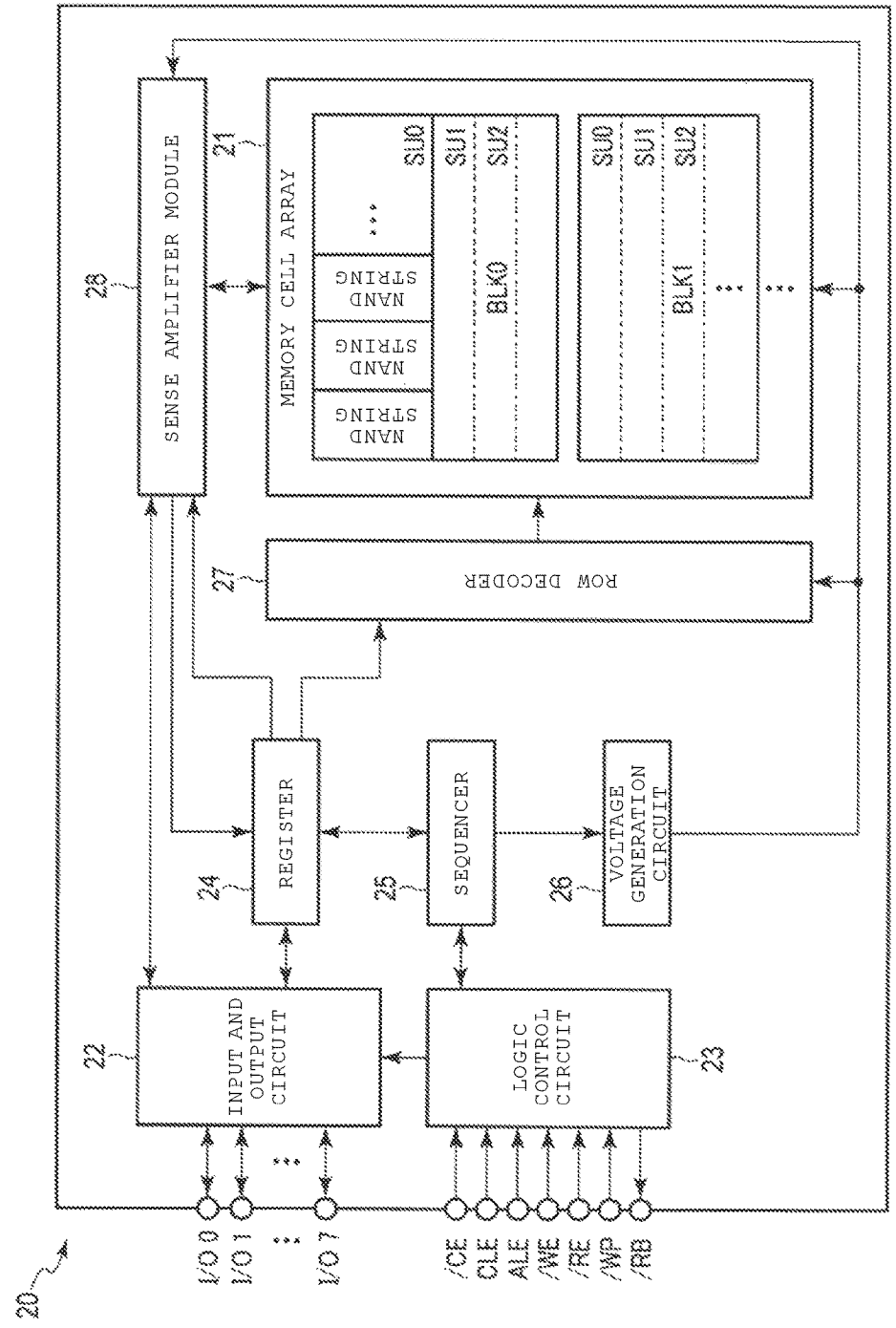
FIG. 2 is a block diagram illustrating a configuration of a semiconductor memory device according to the first embodiment.

Next, an example of a configuration of the semiconductor memory device according to the first embodiment will be described with reference to FIG. 2. FIG. 2 is a block diagram illustrating an example of a configuration of the semiconductor memory device according to the first embodiment.

The semiconductor memory device 20 includes a memory cell array 21, an input and output circuit 22, a logic control circuit 23, a register 24, a sequencer 25, a voltage generation circuit 26, a row decoder 27, and a sense amplifier module 28.

The memory cell array 21 includes a plurality of blocks BLK (BLK0, BLK1, ... ). The block BLK includes a plurality of nonvolatile memory cell transistors (not shown) associated with word lines and bit lines. The block BLK is, for example, a unit of data erasure, and pieces of data within the same block BLK are collectively erased. Each block BLK includes a plurality of string units SU (SU0, SU1, SU2, ... ). Each of the string units SU is a set of NAND strings NS. The NAND string NS includes a plurality of memory cell transistors. Meanwhile, the number of blocks within the memory cell array 21, the number of string units within one block BLK, and the number of NAND strings within one string unit SU can be set to any numbers.

The input and output circuit 22 transmits and receives the signal I/O (I/O0 to I/O7) to and from the controller 10. The input and output circuit 22 transmits a command CMD and an address ADD within the signal I/O to the register 24. The input and output circuit 22 transmits and receives write data and read data to and from the sense amplifier module 28. The input and output circuit 22 receives status STS from the register 24.

The logic control circuit 23 receives the signals /CE, CLE, ALE, /WE, /RE, and /WP from the controller 10. In addition, the logic control circuit 23 transmits the signal /RB to the controller 10 to indicate the state of the semiconductor memory device 20.

The register 24 holds the command CMD and the address ADD. The register 24 transmits the address ADD to the row decoder 27 and the sense amplifier module 28, and transmits the command CMD to the sequencer 25.

The sequencer 25 receives the command CMD, and controls the overall semiconductor memory device 20 in accordance with a sequence based on the received command CMD.

The voltage generation circuit 26 generates a voltage which is necessary for operations such as the writing, reading, and erasing of data, based on an instruction given from the sequencer 25. The voltage generation circuit 26 supplies the generated voltage to the row decoder 27 and the sense amplifier module 28.

The row decoder 27 receives a row address in the address ADD from the register 24 to thereby select a block BLK based on the row address. A voltage applied from the voltage generation circuit 26 through the row decoder 27 is transmitted to the selected block BLK.

The sense amplifier module 28 senses read data which is read to a bit line from a memory cell transistor during the reading of data, and transmits the sensed read data to the input and output circuit 22. The sense amplifier module 28 transmits write data which is written through a bit line to a memory cell transistor during the writing of data. In addition, the sense amplifier module 28 receives a column address in the address ADD from the register 24, and outputs data of a column based on the column address.

1.1.4 With Regard to Configuration of Memory Cell Array

Figure 3:
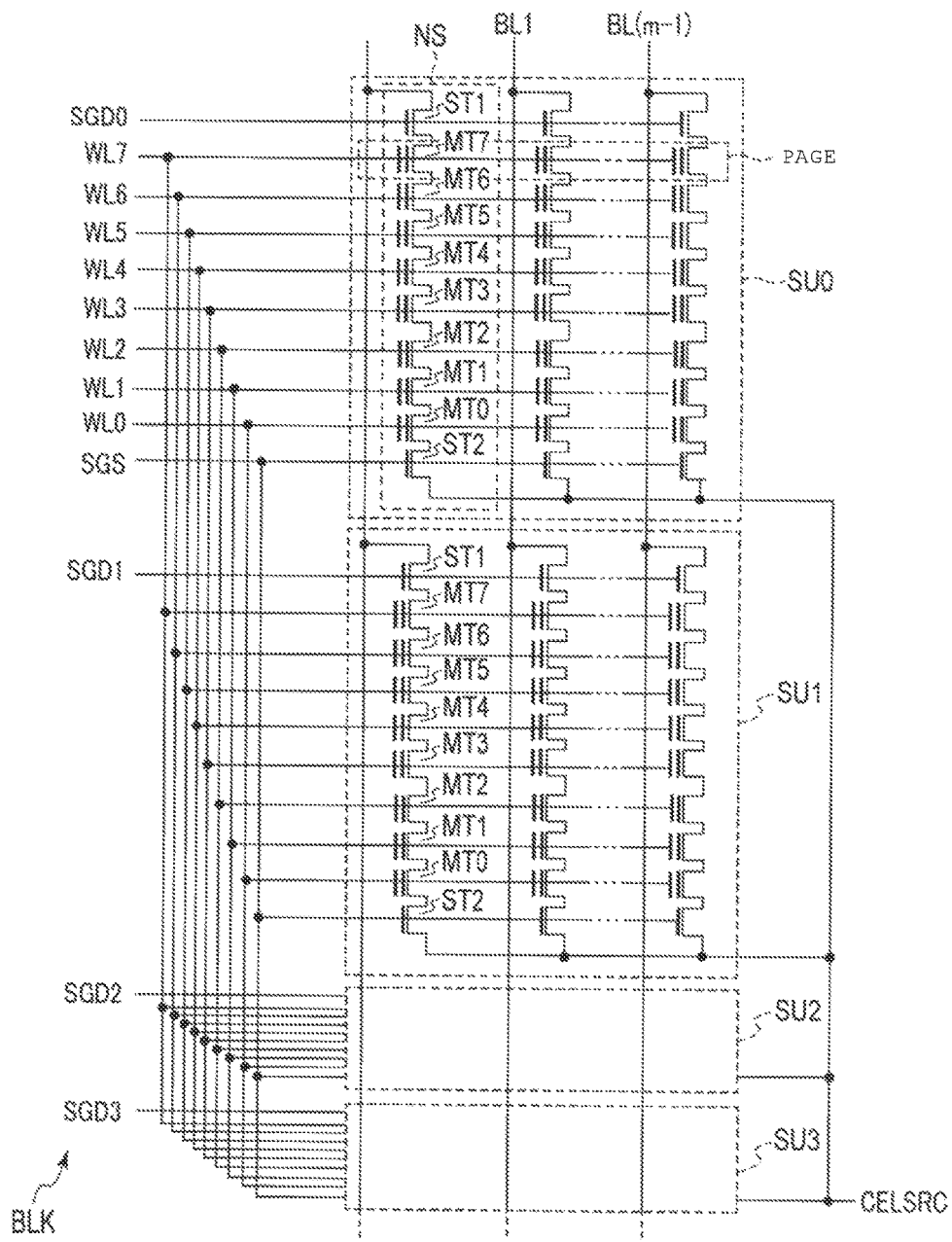
FIG. 3 is a circuit diagram illustrating a configuration of a memory cell array of the semiconductor memory device according to the first embodiment.

Next, a configuration of a memory cell array of the semiconductor memory device according to the first embodiment will be described with reference to FIG. 3. FIG. 3 is an example of a circuit diagram illustrating a configuration of a memory cell array of the semiconductor memory device according to the first embodiment.

As illustrated in FIG. 3, each of the NAND strings NS includes, for example, eight memory cell transistors MT (MT0 to MT7), a select transistor ST1, and a select transistor ST2. Meanwhile, the number of memory cell transistors MT is not limited to eight, and may be 16, 32, 64, 128, or the like, without being limited. The memory cell transistor MT includes a stacked gate including a control gate and a charge storage layer. The memory cell transistors MT are connected to each other between the select transistors ST1 and ST2 in series. Meanwhile, the term "connection" as used in the following description includes a case where another conductive element is interposed between elements.

In a certain block BLK, gates of select transistors ST1 of the string units SU0 to SU3 are connected to selection gate lines SGD0 to SGD3, respectively. In addition, gates of select transistors ST2 of all of the string units SU within the block BLK are connected to a selection gate line SGS in common. Control gates of the memory cell transistors MT0 to MT7 within the same block BLK are connected to the word lines WL0 to WL7, respectively. That is, word lines WL having the same address are connected to all of the string units SU within the same block BLK in common, and the selection gate line SGS is connected to all of the string units SU within the same block BLK in common. On the other hand, the selection gate line SGD is connected to only one string unit SU within the same block BLK.

In addition, the other side ends of select transistors ST1 of NAND strings NS in the same column, among the NAND strings NS arranged in a matrix configuration within the memory cell array 21, are connected to any one of m bit lines BL (BL0 to BL (m−1) (m is a natural number)). In addition, a bit line BL is connected to NAND strings NS in the same column in common over a plurality of blocks BLK.

In addition, the other end of the select transistor ST2 is connected to a source line CELSRC. The source line CELSRC is connected to a plurality of NAND strings NS in common over a plurality of blocks BLK.

As described above, erasing operations of pieces of data are collectively performed, for example, on memory cell transistors MT within the same block BLK. To the contrary, reading and writing of data are collectively performed on a plurality of memory cell transistors MT which are connected to any one word line WL in common in any string unit SU of any block BLK. A unit of the reading and writing is referred to as a "page".

Figure 4:
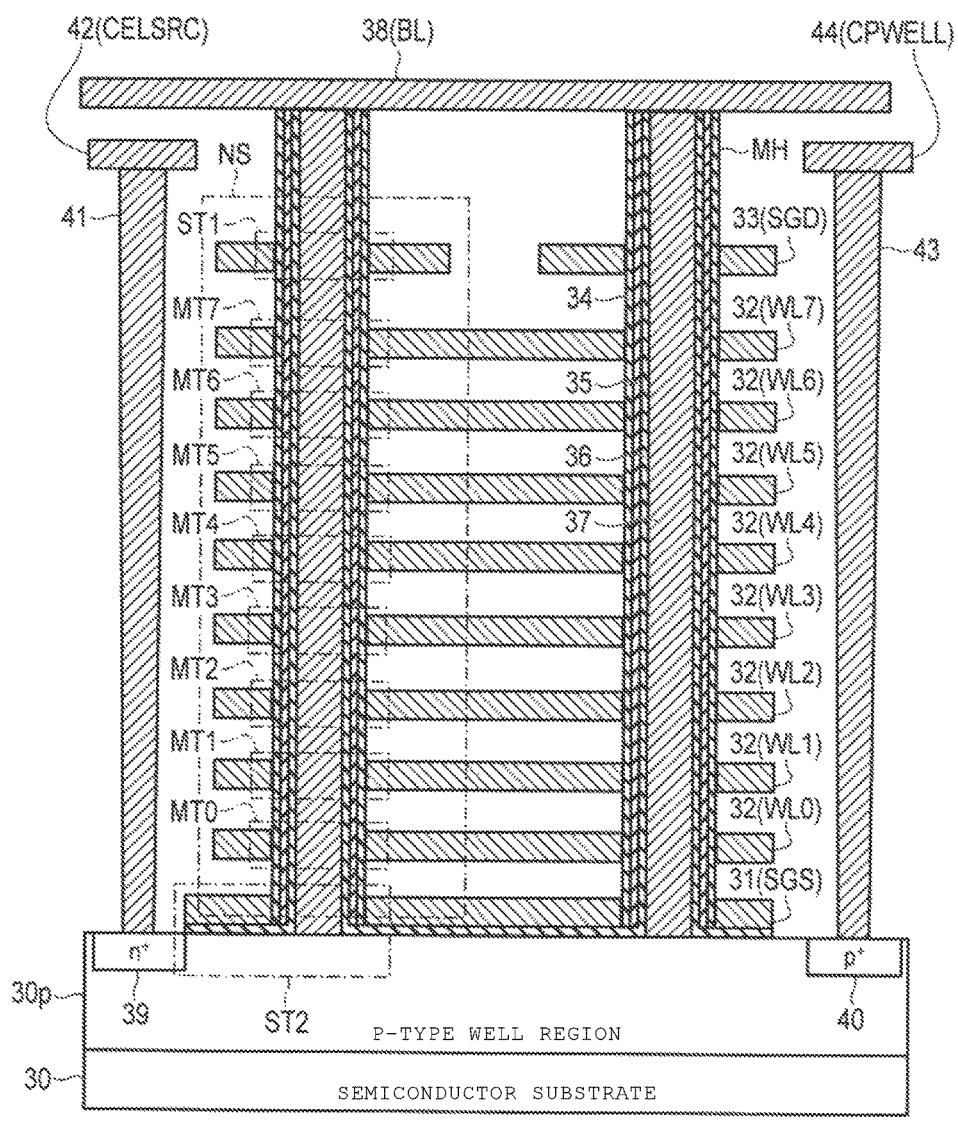
FIG. 4 is a cross-sectional view illustrating a configuration of the memory cell array of the semiconductor memory device according to the first embodiment.

Next, a cross-sectional structure of the memory cell array 21 will be described with reference to FIG. 4. FIG. 4 illustrates an example of a cross-sectional structure of a portion of the memory cell array of the semiconductor memory device according to the first embodiment. In particular, FIG. 4 illustrates a portion regarding two string units SU within one block BLK. Specifically, FIG. 4 illustrates two NAND strings NS of two respective string units SU and portions in the vicinity thereof. A plurality of structures illustrated in FIG. 4, are arranged in an X-direction, and, for example, a set of a plurality of NAND strings NS which are lined up in the X-direction is equivalent to one string unit SU.

The semiconductor memory device 20 is provided on the semiconductor substrate 30. In the following description, a surface parallel to the surface of the semiconductor substrate 30 is an XY plane, and a direction perpendicular to the XY plane is a Z-direction. In addition, it is assumed that the X-direction and the Y-direction are perpendicular to each other.

A p-type well region 30p is provided on the upper surface of the semiconductor substrate 30. A plurality of NAND strings NS are provided on the p-type well region 30p. That is, for example, a wiring layer 31 functioning as the selection gate line SGS, eight wiring layers 32 (WL0 to WL7) functioning as the word lines WL0 to WL7, and a wiring layer 33 functioning as the selection gate line SGD are sequentially stacked on the p-type well region 30p. A plurality of wiring layers 31 and 33 may be stacked. An insulating film not shown in the drawing is provided between the stacked wiring layers 31 to 33.

The wiring layer 31 is connected in common to, for example, gates of select transistors ST2 of a plurality of NAND strings NS within one block BLK. The wiring layer 32 is connected in common to control gates of memory cell transistors MT of a plurality of NAND strings NS within one block BLK for each layer. The wiring layer 33 is connected in common to gates of select transistors ST1 of a plurality of NAND strings NS within one string unit SU.

A memory hole MH is provided so as to pass through the wiring layers 33, 32, and 31 and to reach the p-type well region 30p. A block insulating film 34, a charge storage layer (insulating film) 35, and a tunnel oxide film 36 are provided in order on the side surface of the memory hole MH. A semiconductor pillar 37 is buried in the memory hole MH. The semiconductor pillar 37 is, for example, undoped polysilicon, and functions as a current path of the NAND string NS. A wiring layer 38 functioning as a bit line BL is provided on the upper end of the semiconductor pillar 37.

As described above, a select transistor ST2, a plurality of memory cell transistors MT, and a select transistor ST1 are stacked in order on the p-type well region 30p, and one memory hole MH corresponds to one NAND string NS.

An n+ type impurity diffusion region 39 and a p+ type impurity diffusion region 40 are provided on the upper surface of the p-type well region 30p. A contact plug 41 is provided on the upper surface of the n+ type impurity diffusion region 39. A wiring layer 42 functioning as a source line CELSRC is provided on the upper surface of the contact plug 41. A contact plug 43 is provided on the upper surface of the p+ type impurity diffusion region 40. A wiring layer 44 functioning as a well line CPWELL is provided on the upper surface of the contact plug 43.

The configuration of the memory cell array 21 may have a different configuration, such as ones disclosed in U.S. patent application Ser. No. 12/407,403, filed on Mar. 19, 2009, which is entitled "THREE DIMENSIONAL STACKED NONVOLATILE SEMICONDUCTOR MEMORY," U.S. patent application Ser. No. 12/406,524, filed on Mar. 18, 2009, which is entitled "THREE DIMENSIONAL NONVOLATILE SEMICONDUCTOR MEMORY," U.S. patent application Ser. No. 12/679,991, filed on Mar. 25, 2010, which is entitled "NONVOLATILE SEMICONDUCTOR STORAGE DEVICE AND METHOD OF MANUFACTURING THE SAME," and U.S. patent application Ser. No. 12/532,030, filed on Mar. 23, 2009, which is entitled "SEMICONDUCTOR MEMORY AND METHOD FOR MANUFACTURING THE SAME." The entire contents of all of these patent applications are incorporated by reference herein.

Figure 5:
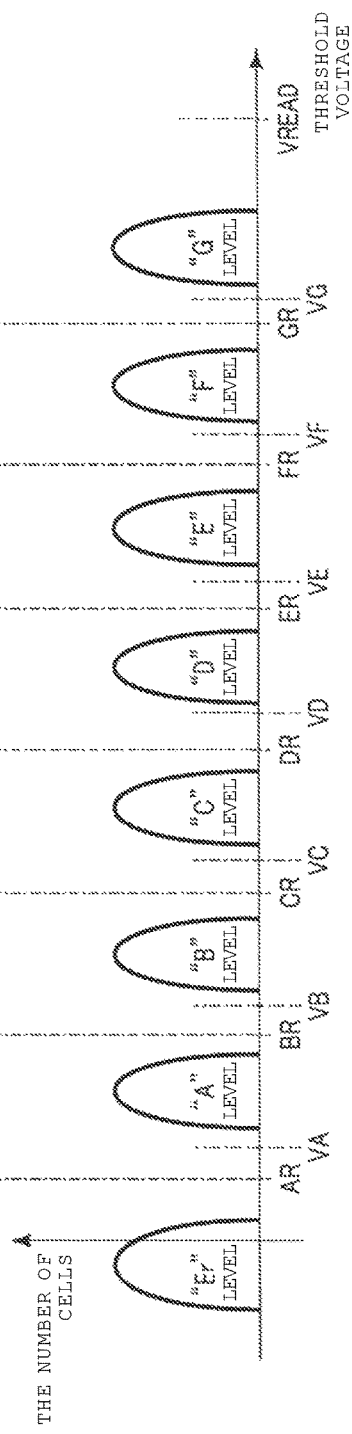
FIG. 5 is a diagram illustrating the distribution of threshold voltages of a memory cell transistor of the semiconductor memory device according to the first embodiment.

1.1.5 With Regard to Distribution of Threshold Voltages of Memory Cell Transistor Next, the distribution of threshold voltages of a memory cell transistor MT will be described with reference to FIG. 5. FIG. 5 is a diagram illustrating an example of the distribution of threshold voltages of a memory cell transistor of the semiconductor memory device according to the first embodiment.

As illustrated in FIG. 5, a memory cell transistor MT can hold 3-bit data based on an upper bit (upper data), a middle bit (middle data), and a lower bit (lower data), that is, data of "111", "110", "100", "000", "010", "011", "001", and "101".

The memory cell transistor MT holding data of "111" has a threshold voltage at an "Er" level, and is equivalent to, for example, a data erased state. The threshold voltage included in the "Er" level is smaller than voltage AR, and has a positive or negative value.

Threshold voltages corresponding to pieces of data of "110", "100", "000", "010", "011", "001", and "101" held in the memory cell transistor MT are at "A", "B", "C", "D", "E", "F", and "G" levels, respectively. The "A" level to the "G" level are equivalent to a state where data is written in a memory cell transistor MT by injecting charges into a charge storage layer 45, and a threshold voltage included in each distribution has, for example, a positive value. The threshold voltage included in the "A" level is larger than a verification voltage VA that is larger than a read voltage AR, and is smaller than a read voltage BR. The threshold voltage included in the "B" level is larger than a verification voltage VB that is larger than the read voltage BR, and is smaller than a read voltage CR. The threshold voltage included in the "C" level is larger than a verification voltage VC that is larger than the read voltage CR, and is smaller than a read voltage DR. The threshold voltage included in the "D" level is larger than a verification voltage VD that is larger than the read voltage DR, and is smaller than a read voltage ER. The threshold voltage included in the "E" level is larger than a verification voltage VE that is larger than the read voltage ER, and is smaller than a read voltage FR. The threshold voltage included in the "F" level is larger than a verification voltage VF that is larger than the read voltage FR, and is smaller than a read voltage GR. The threshold voltage included in the "G" level is larger than a verification voltage VG that is larger than the read voltage GR, and is smaller than voltage VREAD. The voltage VREAD is a voltage applied to a word line WL which is not a read target, during the reading of data into a certain block BLK.

As described above, each memory cell transistor MT can have a threshold voltage that is in any one of eight threshold voltage distributions and thus can be in any one of eight states. Meanwhile, a relationship between each piece of data and a threshold voltage level is not limited to that described above, and can be appropriately modified.

In addition, as described above, the writing and reading of data is performed in units of pages. Accordingly, when a memory cell transistor MT holds 3-bit data, data corresponding to each of an upper bit, a middle bit, and a lower bit is allocated to one page. In the following description, pages in which writing or reading is collectively performed with respect to an upper bit, a middle bit, and a lower bit will be referred to as an upper page, a middle page, and a lower page, respectively.

Meanwhile, when all of lower data, middle data, and upper data are input, the sequencer 25 can identify in which state of the above-described eight different states a memory cell transistor MT has to be set at. In other words, when any of the lower data, the middle data, and the upper data is not input, the sequencer 25 cannot uniquely identify such a state.

FIGS. 6A and 6B are tables illustrating a relationship between data of the semiconductor memory device according to the first embodiment and a threshold voltage level capable of being identified from the data. FIG. 6A illustrates threshold voltages capable of being identified when only lower data is input. FIG. 6B illustrates threshold voltages capable of being identified when lower data and middle data are input.

In FIG. 6A, where only lower data is input, eight different states from an "Er" level to a "G" level are expressed as either "0" or "1". Specifically, the "Er" level, the "E" level, the "F" level, and the "G" level are expressed as "1" by lower data. For this reason, the "Er" level, the "E" level, the "F" level, and the "G" level cannot be distinguished from each other. In addition, the "A" level, the "B" level, the "C" level, and the "D" level are expressed as "0" by lower data. For this reason, the "A" level, the "B" level, the "C" level, and the "D" level cannot be distinguished from each other.

In FIG. 6B, where lower data and middle data are input, eight different states from an "Er" level to a "G" level are expressed as "00", "01", "10", or "11". Specifically, the "Er" level and the "E" level are expressed as "11" by lower data and middle data. For this reason, the "E" level cannot be distinguished from the "Er" level. The "A" level and the "D" level are expressed as "10" by lower data and middle data. For this reason, the "D" level cannot be distinguished from the "A" level. The "B" level and the "C" level are expressed as "00" by lower data and middle data. For this reason, the "C" level cannot be distinguished from the "B" level. In addition, the "F" level and the "G" level are expressed as "01" by lower data and middle data. For this reason, the "G" level cannot be distinguished from the "F" level.

1.1.6 With Regard to Configuration of Sense Amplifier Module

Figure 7:
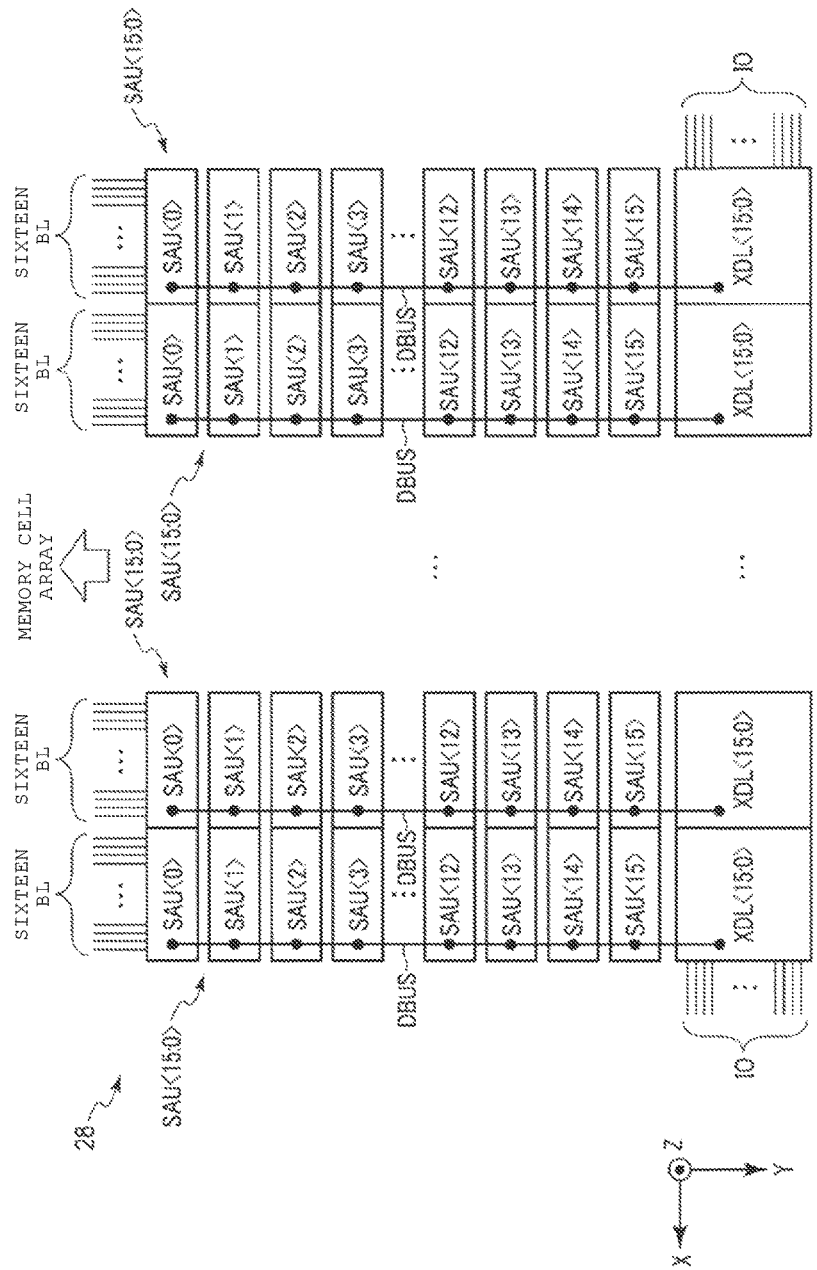
FIG. 7 is a plan view illustrating a configuration of a sense amplifier module of the semiconductor memory device according to the first embodiment.

Next, a configuration of a sense amplifier module of the semiconductor memory device according to the first embodiment will be described. FIG. 7 is a plan view illustrating an example of a configuration of a sense amplifier module of the semiconductor memory device according to the first embodiment. As illustrated in FIG. 7, the sense amplifier module 28 includes a plurality of sense amplifier unit groups SAU<15:0> and a plurality of latch circuit groups XDL<15:0>.

The plurality of sense amplifier unit groups SAU<15:0> are lined up along the X-direction. In the example of FIG. 7, each of the sense amplifier unit groups SAU<15:0> includes 16 sense amplifier units SAU (SAU<0>, SAU<1>, . . . , and SAU<15>) which are lined up along the Y-direction.

The sense amplifier unit SAU is provided, for example, for each bit line BL. The sense amplifier unit SAU senses data which has been transmitted to the corresponding bit line BL, and transmits write data to the corresponding bit line BL. In addition, the sense amplifier units SAU within the sense amplifier unit group SAU<15:0> are connected to one bus DBUS in common.

The latch circuit groups XDL<15:0> are lined up along the X-direction. Each of the latch circuit group XDL<15:0> includes 16 latch circuits XDL (XDL<0>, XDL<1>, . . . , and XDL<15>). The latch circuit group XDL<15:0> is provided for each sense amplifier unit group SAU<15:0>. In addition, 16 latch circuits XDL<0> to XDL<15> respectively corresponding to 16 sense amplifier units SAU<0> to SAU<15> are connected to one bus DBUS in common. The latch circuits XDL temporarily hold data related to the bit lines BL connected to the corresponding sense amplifier units SAU. In addition, the latch circuits XDL are connected to wirings IO that transmit a signal I/O. The latch circuit XDL is used for the transmission and reception of data between the sense amplifier unit SAU and the outside through the wirings IO, and the bus DBUS. Specifically, data received from the controller 10 is held in the latch circuit XDL through the wirings IO, and is then transmitted to the sense amplifier units SAU through the bus DBUS. In addition, the data transmitted from the sense amplifier units SAU is held in the latch circuit XDL through the bus DBUS, and is then transmitted to the controller 10 through the wirings IO.

1.1.7 With Regard to Configuration of Sense Amplifier Unit

Figure 8:
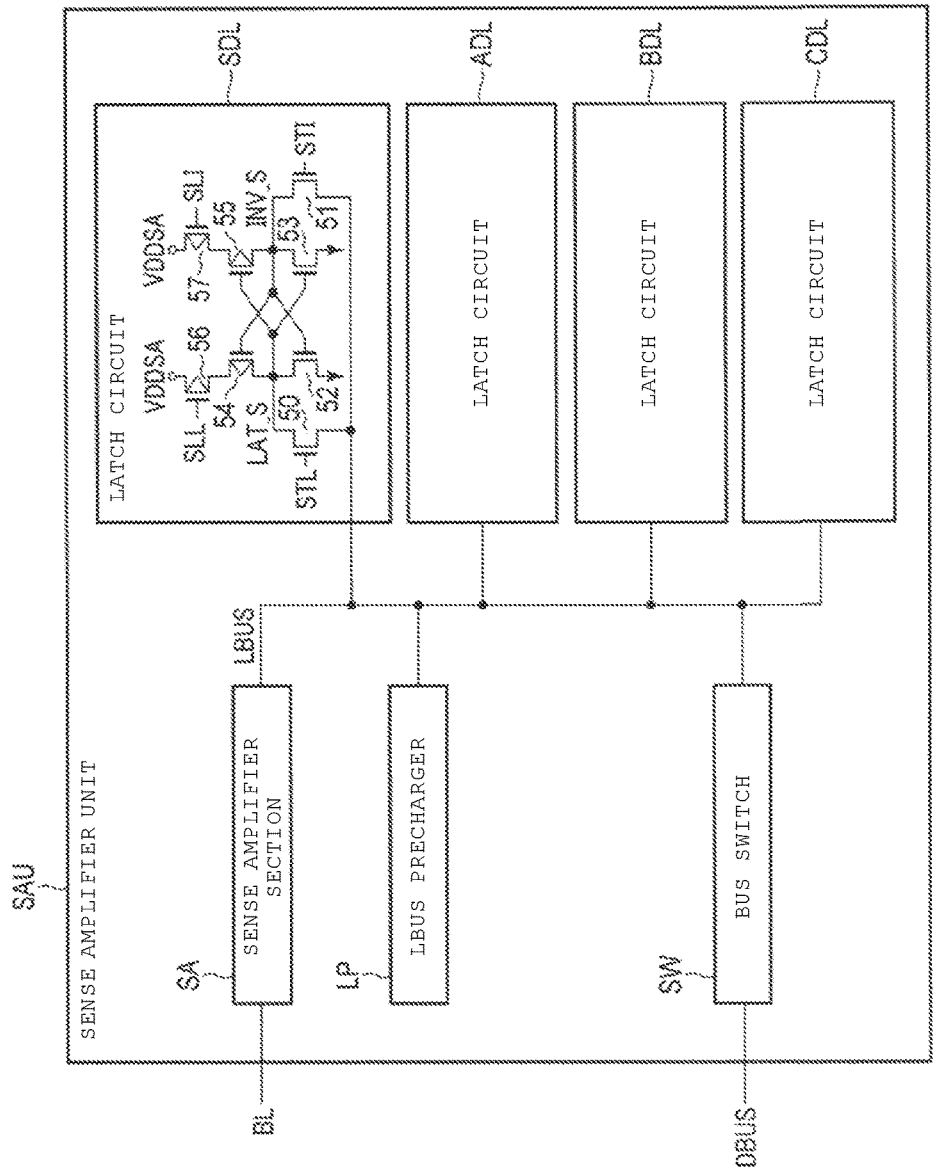
FIG. 8 is a circuit diagram illustrating a configuration of a sense amplifier unit of the semiconductor memory device according to the first embodiment.

Next, a configuration of a sense amplifier unit of the semiconductor memory device according to the first embodiment will be described. FIG. 8 is a circuit diagram illustrating an example of a configuration of a sense amplifier unit of the semiconductor memory device according to the first embodiment.

As illustrated in FIG. 8, a sense amplifier unit SAU includes a sense amplifier section SA, four latch circuits SDL, ADL, BDL, and CDL, an LBUS precharger LP, and a bus switch SW. The sense amplifier unit SAU is connected to a bus DBUS and a bit line BL.

The sense amplifier section SA controls the bit line BL in accordance with data held in the latch circuit SDL. The LBUS precharger LP transmits a voltage to the bus LBUS to thereby precharge the bus LBUS. The bus switch SW functions as a switch for transmitting data between the sense amplifier unit SAU and the latch circuit XDL.

The latch circuits SDL, ADL, BDL, and CDL temporarily hold write data and read data. In a data write operation, the latch circuits ADL, BDL, and CDL are used, for example, for a multi-value operation in which individual memory cell transistors MT hold data of two bits or more.

More specifically, for example, the latch circuit SDL holds information indicating whether or not data is written in the memory cell transistor MT in a data write operation. The latch circuits ADL, BDL, and CDL hold, for example, lower bit, middle bit, and upper bit of data written in the memory cell transistor MT.

The latch circuit SDL includes low breakdown voltage n-channel MOS transistors 50 to 53 and low breakdown voltage p-channel MOS transistors 54 to 57. In the following description, a low breakdown voltage n-channel MOS transistor, and a low breakdown voltage p-channel MOS transistor will be simply referred to as a transistor when the two types of transistors do not need to be distinguished from each other.

In the transistor 50, a signal STL is input to a gate, one end thereof is connected to the bus LBUS, and the other end thereof is connected to a node LAT_S.

In the transistor 51, a signal STI is input to a gate, one end thereof is connected to the bus LBUS, and the other end thereof is connected to a node INV_S.

In the transistor 52, a gate is connected to the node INV_S, one end thereof is grounded, the other end thereof is connected to the node LAT_S.

In the transistor 53, a gate is connected to the node LAT_S, one end thereof is grounded, and the other end thereof is connected to the node INV_S.

In the transistor 54, a gate is connected to the node INV_S, one end thereof is connected to the node LAT_S, and the other end thereof is connected to one end of a transistor 56.

In the transistor 55, a gate is connected to the node LAT_S, one end thereof is connected to the node INV_S, and the other end thereof is connected to one end of a transistor 57.

In the transistor 56, a signal SLL is input to a gate, and voltage VDDSA is applied to the other end thereof.

In the transistor 57, a signal SLI is input to a gate, and the voltage VDDSA is applied to the other end thereof.

In the latch circuit SDL, a first inverter is made up of the transistors 52 and 54, and a second inverter is made up of the transistors 53 and 55. An output of the first inverter and an input (node LAT_S) of the second inverter are connected to the bus LBUS through the transistor 50 for the transmission of data. In addition, an input of the first inverter and an output (node INV_S) of the second inverter are connected to the bus LBUS through the transistor 51 for the transmission of data. The latch circuit SDL holds data by the node LAT_S, and holds the inverted data thereof by the node INV_S.

The latch circuits ADL, BDL, and CDL have the same configuration, for example, as that of the latch circuit SDL, and thus a description thereof will not be repeated. In each of the sense amplifier units SAU, a sense amplifier section SA and four latch circuits SDL, ADL, BDL, and CDL are connected to each other by the bus LBUS so as to be capable of transmitting and receiving data to and from each other.

Meanwhile, various types of signals in a sense amplifier unit SAU having the above-described configuration are applied by, for example, the sequencer 25.

Meanwhile, in the following description, when a block BLK, a memory cell transistor MT, and a word line WL and a sense amplifier unit SAU which are connected to the memory cell transistor MT are targets for the writing or reading of data, the term "selected" will be attached to each of the terms. In addition, in a case of not being targets for the writing or reading of data, the term "non-selected" will be attached to each of the terms.

1.2 With Regard to Write Operation

Next, a write operation of the semiconductor memory device according to the first embodiment will be described.

1.2.1 With Regard to Command Sequence

A command sequence of a write operation according to the first embodiment will be described.

Figure 9:
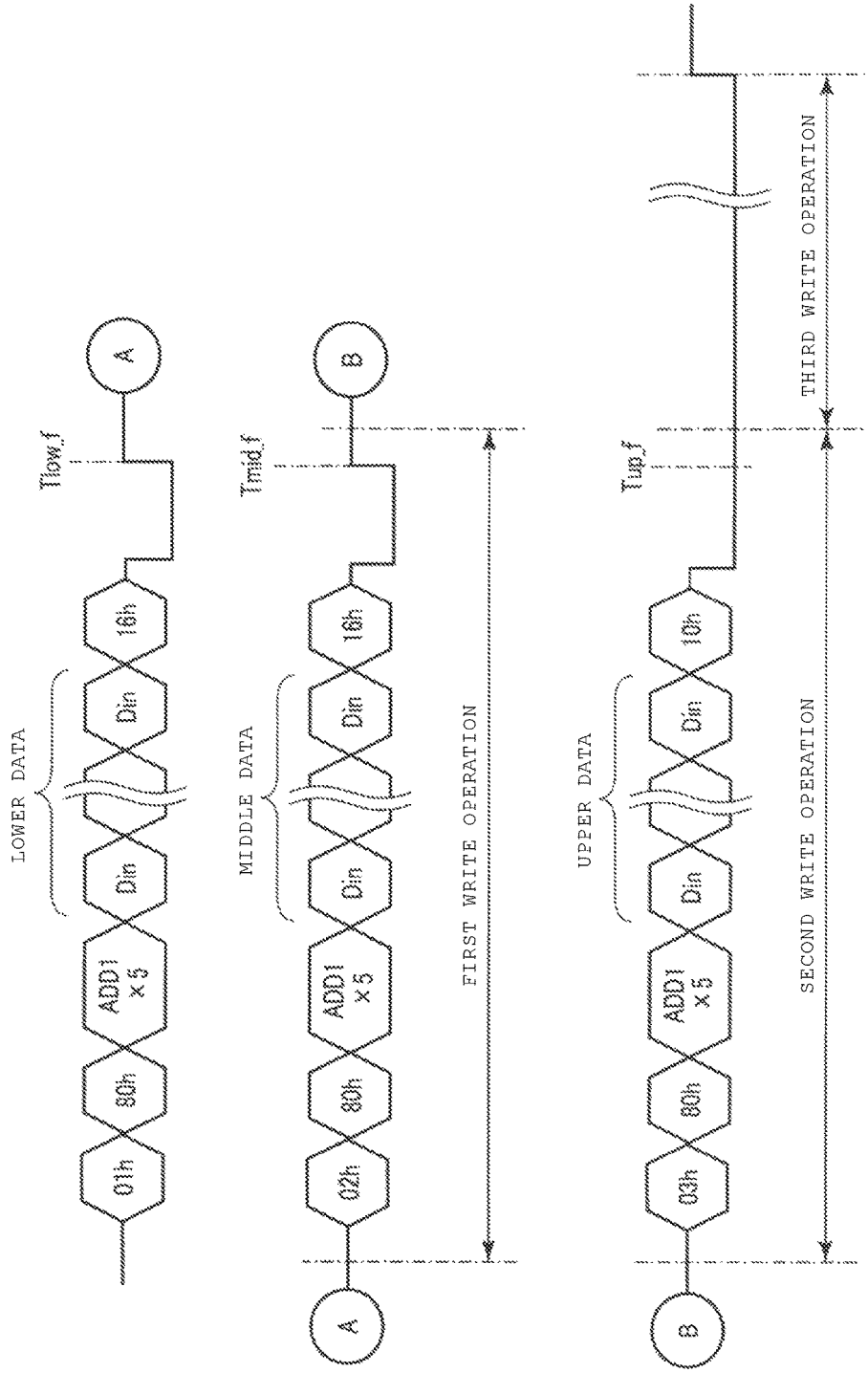
FIG. 9 is a command sequence illustrating a data write operation of the semiconductor memory device according to the first embodiment.

FIG. 9 is an example of a command sequence illustrating a data write operation of the semiconductor memory device according to the first embodiment. In FIG. 9, a relationship between one write operation, which is performed prior to another write operation while the semiconductor memory device 20 receives commands relating to the other write operation, and a command sequence is illustrated over time.

As illustrated in FIG. 9, the controller 10 issues a command "01h" and a write command "80h", and transmits the issued commands to the semiconductor memory device 20. The command "80h" is a command for instructing the writing of data in the semiconductor memory device 20. When the semiconductor memory device 20 receives the command "01h" and the command "80h" which are sequential, the semiconductor memory device recognizes that the write data DAT that follows (illustrated as Din) is lower data.

The controller 10 issues, for example, an address ADD over five cycles, and transmits the issued address to the semiconductor memory device 20. The address ADD designates, for example, an address of a certain region within a selected block BLK. The address ADD may designate not only the address of the certain region within the selected block BLK but also an address of a latch circuit (for example, a latch circuit ADL) within a selected sense amplifier unit SAU. Subsequently, the controller 10 transmits write data DAT indicating lower data to the semiconductor memory device 20.

The controller 10 issues a command "16h" and transmits the issued command to the semiconductor memory device 20. The command "16h" is a command for inputting data DAT, which is transmitted immediately before, to a latch circuit (for example, a latch circuit ADL) within a selected sense amplifier unit SAU. In addition, the command "16h" is a command for further performing a special write operation based on the data DAT as soon as the input of the data is completed. In the special write operation, for example, a different write operation is performed in accordance with the input data. More specifically, when lower data is input, the command "16h" performs a write operation based on only the lower data, as a special write operation. In the following description, a write operation based on only lower data will be referred to as a "first write operation". In addition, a set of commands "01h", "80h", and "16h" is a command set capable of performing the first write operation, and may also be simply referred to as a "command" capable of performing the first write operation.

As illustrated in FIG. 6, when only lower data is input, the sequencer 25 cannot discriminate which of an "Er" level, an "E" level, an "F" level, and a "G" level the level of a threshold voltage of data to be written in a memory cell transistor MT (hereinafter, referred to as a "target threshold voltage level") indicates. For this reason, in the first write operation, the sequencer 25 regards the lowest "Er" level as being written in a memory cell transistor MT in which the "Er" level, the "E" level, the "F" level, and the "G" level are to be written. In addition, the sequencer 25 cannot discriminate which of an "A" level, a "B" level, a "C" level, and a "D" level a target threshold voltage level indicates. For this reason, in the first write operation, the sequencer 25 regards the lowest "A" level as being written in a memory cell transistor MT in which the "A" level, the "B" level, the "C" level, and the "D" level are to be written.

When the command "16h" is stored in the register 24, the sequencer 25 controls the voltage generation circuit 26, the sense amplifier module 28, and the like to thereby start inputting lower data to the latch circuit ADL. At this time, the logic control circuit 23 sets a signal RB to be at an "L" level and informs the controller 10 that the semiconductor memory device 20 is in a busy state.

After the input of the lower data to the latch circuit ADL is completed at time Tlow_f, the logic control circuit 23 sets the signal /RB to be at an "H" level and informs the controller 10 that the semiconductor memory device 20 is in a ready state. When the time Tlow_f elapses, the sequencer 25 controls the voltage generation circuit 26, the row decoder 27, the sense amplifier module 28, and the like to thereby start the first write operation.

Subsequently, the controller 10 issues a command "02h" and a write command "80h", and transmits the issued commands to the semiconductor memory device 20. When the semiconductor memory device 20 receives the command "02h" and the command "80h" which are sequential, the semiconductor memory device recognizes that the write data DAT that follows (illustrated as Din) is middle data.

The controller 10 issues, for example, an address ADD over five cycles, and transmits the issued address to the semiconductor memory device 20. The address ADD designates, for example, an address of a certain region within a selected block BLK. The address ADD may designate not only the address of the certain region within the selected block BLK but also an address of a latch circuit (for example, a latch circuit BDL) within a selected sense amplifier unit SAU. Subsequently, the controller 10 transmits write data DAT indicating middle data to the semiconductor memory device 20.

The controller 10 issues a command "16h" and transmits the issued command to the semiconductor memory device 20. When middle data is input, the command "16h" performs a write operation based on lower data and middle data, as a special write operation. In the following description, a write operation based on only lower data and middle data will be referred to as a "second write operation". In addition, a set of commands "02h", "80h", and "16h" is a command set capable of performing the second write operation, and may also be simply referred to as a "command" capable of performing the second write operation.

As illustrated in FIG. 6, when only lower data and middle data are input, the sequencer 25 cannot discriminate which of an "Er" level and an "E" level a target threshold voltage level indicates. For this reason, in the second write operation, the sequencer 25 regards the "Er" level, which is a lower level, as being written in a memory cell transistor MT in which the "Er" level and the "E" level are to be written. In addition, the sequencer 25 cannot discriminate which of an "A" level and a "D" level a target threshold voltage level indicates. For this reason, in the second write operation, the sequencer 25 regards the "A" level, which is a lower level, as being written in a memory cell transistor MT in which the "A" level and the "D" level are to be written. In addition, the sequencer 25 cannot discriminate which of a "B" level and a "C" level a target threshold voltage level indicates. For this reason, in the second write operation, the sequencer 25 regards the "B" level, which is a lower level, as being written in a memory cell transistor MT in which the "B" level and the "C" level are to be written. In addition, the sequencer 25 cannot discriminate which of an "F" level and a "G" level a target threshold voltage level indicates. For this reason, in the second write operation, the sequencer 25 regards the "F" level, which is a lower level, as being written in a memory cell transistor MT in which the "F" level and the "G" level are to be written.

When the command "16h" is stored in the register 24, the sequencer 25 controls the voltage generation circuit 26, the sense amplifier module 28, and the like to thereby start inputting middle data to the latch circuit BDL. At this time, the logic control circuit 23 sets the signal /RB to be at an "L" level and informs the controller 10 that the semiconductor memory device 20 is in a busy state.

After the input of the middle data to the latch circuit BDL is completed at time Tmid_f, the logic control circuit 23 sets the signal /RB to be at an "H" level and informs the controller 10 that the semiconductor memory device 20 is in a ready state. When the time Tmid_f elapses, the sequencer 25 controls the voltage generation circuit 26, the row decoder 27, the sense amplifier module 28, and the like to thereby transition from the first write operation to the second write operation.

Subsequently, the controller 10 issues a command "03h" and a write command "80h", and transmits the issued commands to the semiconductor memory device 20. When the semiconductor memory device 20 receives the command "03h" and the command "80h" which are sequential, the semiconductor memory device recognizes that the write data DAT that follows (illustrated as Din) is upper data.

The controller 10 issues, for example, an address ADD over five cycles, and transmits the issued address to the semiconductor memory device 20. The address ADD designates, for example, an address of a certain region within a selected block BLK. The address ADD may designate not only the address of the certain region within the selected block BLK but also an address of a latch circuit (for example, a latch circuit CDL) within a selected sense amplifier unit SAU. Subsequently, the controller 10 transmits write data DAT indicating upper data to the semiconductor memory device 20.

The controller 10 issues a command "10h" and transmits the issued command to the semiconductor memory device 20. The command "10h" is a command for inputting data DAT, which is transmitted immediately before, to a latch circuit within a selected sense amplifier unit SAU. In addition, the command "10h" is a command for further performing a third write operation based on lower data, middle data, and upper data. In the following description, a write operation based on the lower data, the middle data, and the upper data will be referred to as a "third write operation". That is, in the third write operation, a write operation based on a threshold voltage level which is to be originally written is performed in all of the memory cell transistor MT. In addition, a set of "03h", "80h", and "10h" is a command set capable of performing the third write operation, and may also be simply referred to as a "command" capable of performing the third write operation.

When the command "10h" is stored in the register 24, the sequencer 25 controls the voltage generation circuit 26, the sense amplifier module 28, and the like to thereby start inputting upper data to the latch circuit CDL. At this time, the logic control circuit 23 sets the signal /RB to be at an "L" level and informs the controller 10 that the semiconductor memory device 20 is in a busy state.

The sequencer 25 completes the input of the upper data to the latch circuit CDL at time Tup_f. When the time Tup_f elapses, the sequencer 25 controls the voltage generation circuit 26, the row decoder 27, the sense amplifier module 28, and the like to thereby transition from the second write operation to the third write operation.

By the above-described operation, the first write operation is performed during the input of the middle data, the second write operation is performed during the input of the upper data, and the third write operation is performed after the input of all of the pieces of data is completed.

1.2.2 With Regard to Outline of Write Operation

Next, an outline of a write operation according to the first embodiment will be simply described.

Each of the first write operation, second write operation, and third write operation includes, for example, a programming operation and a verifying operation. The programming operation is an operation of increasing a threshold voltage by injecting electrons into the charge storage layer 45 of the selected memory cell transistor MT, or an operation of maintaining a threshold voltage by inhibiting the injection of electrons. The verifying operation is an operation of determining whether or not a threshold voltage of the selected memory cell transistor MT has reached a verification voltage, by reading out data after a programming operation is performed. In the selected memory cell transistor MT having a threshold voltage that has reached a verification voltage, the injection of electrons during the programming operation is inhibited thereafter. A combination of the programming operation and the verifying operation is repeated a plurality of times, until the threshold voltage of the selected memory cell transistor MT is increased up to the verification voltage. An operation of repeating the programming operation and the verifying operation is referred to as a "loop".

In addition, a write operation is classified as a different "phase" in accordance with, for example, the number of loops. A write operation in loops classified as the same phase includes, for example, a programming operation and verifying operations targeted at the same level.

Figure 10:
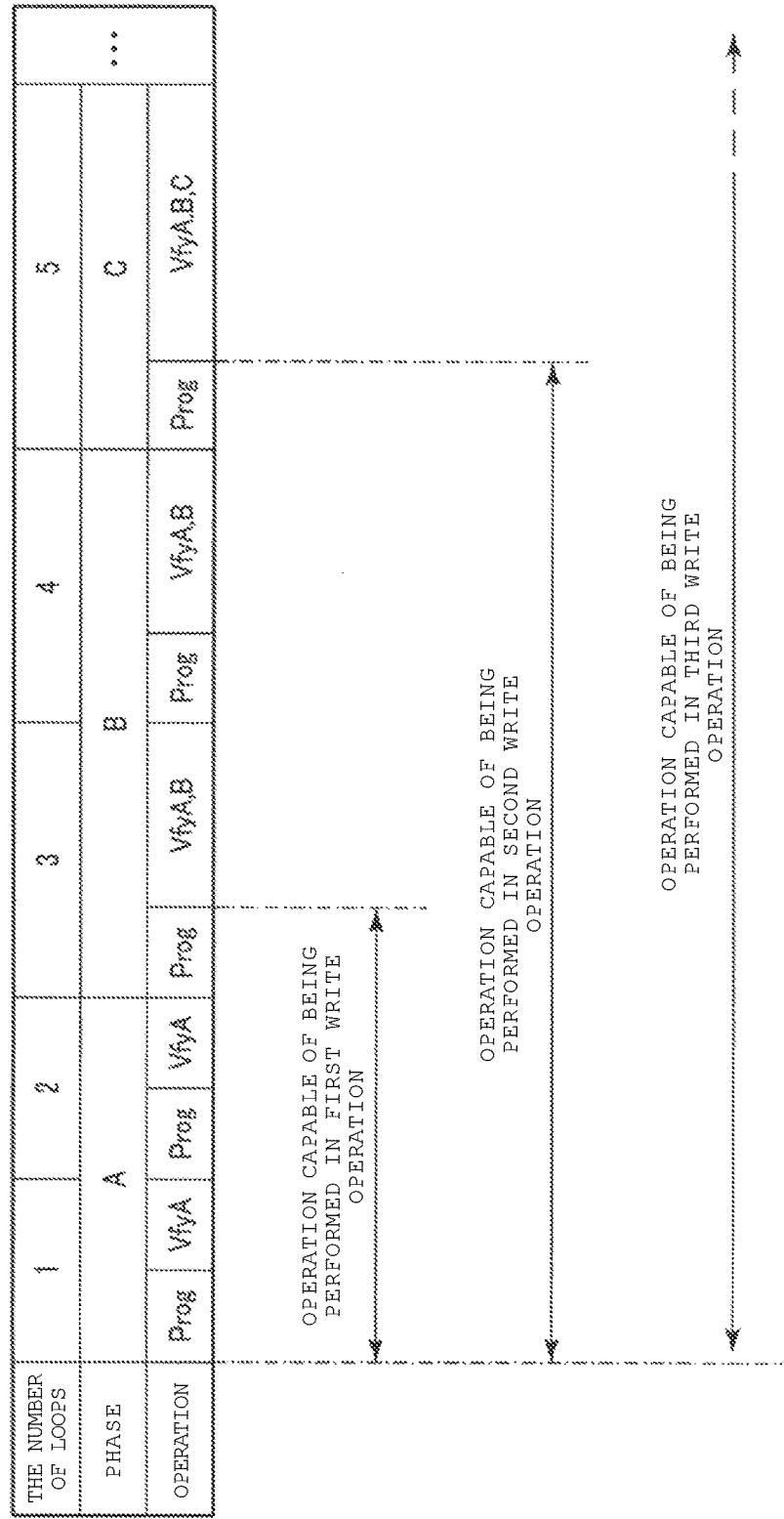
FIG. 10 is a schematic diagram illustrating a write operation of the semiconductor memory device according to the first embodiment.

FIG. 10 is a schematic diagram illustrating an outline of a write operation of the semiconductor memory device according to the first embodiment. FIG. 10 illustrates an example of a configuration of a write operation which is set in accordance with the number of loops. In addition, FIG. 10 schematically illustrates in which of a first write operation, a second write operation, and a third write operation the operations may be included.

As illustrated in FIG. 10, first and second loops are classified as phase A. In the phase A, a verifying operation targeted at an "A" level (denoted by VfyA in FIG. 10) is performed with respect to one programming operation (denoted by Prog in FIG. 10). Third and fourth loops are classified as phase B. In the phase B, a verifying operation targeted at a "B" level (denoted by VfyA,B in FIG. 10) is performed with respect to one programming operation, in addition to a verifying operation targeted at an "A" level. A fifth loop is classified as phase C. In the phase C, a verifying operation targeted at a "C" level (denoted by VfyA,B,C in FIG. 10) is further performed with respect to one programming operation, in addition to a verifying operation targeted at an "A" level and a verifying operation targeted at a "B" level. Similarly, regarding a sixth loop and the subsequent loops, a programming operation and a verifying operation based on a certain phase are performed. Finally, verifying operations are performed up to a verifying operation targeted at a "G" level.

Meanwhile, as which phase a certain number of loops are classified (in other words, with what number of loops a verifying operation targeted at a new level is performed) does not depend on the above-described example, and can be set in a different manner.

In addition, a verifying operation in a certain phase may include a verifying operation in a prior phase. For example, the verifying operation in the phase B may include the verifying operation in the phase A (verifying operation targeted at only the "A" level). The verifying operation in the phase C may include the verifying operation in the phase A and the verifying operation in the phase B (verifying operations targeted at only the "A" level and the "B" level). The execution of a verifying operation in a phase before a certain phase may occur when the magnitude of a write voltage is not increased to such an extent that it is not necessary to perform a verifying operation targeted at a new level, for example, in a case where a phase transitions due to the passage of the number of loops.

A write operation configured as illustrated in FIG. 10 is performed in any of a first write operation, a second write operation, and a third write operation. An operation capable of being performed in each of the first write operation, the second write operation, and the third write operation is, however, limited.

For example, in the first write operation, it is possible to discriminate whether a target threshold voltage level is an "Er" level or an "A" level, but it is not possible to discriminate whether a target threshold voltage level is an "A" level or a "B" level. For this reason, in the first write operation, only a verifying operation targeted at an "A" level can be performed. In other words, in the first write operation, a write operation classified as phase A, and a programming operation in a first loop in a write operation classified as phase B can be performed.

In the second write operation, for example, it is possible to discriminate whether a target threshold voltage level is an "A" level or a "B" level, but it is not possible to discriminate whether a target threshold voltage level is a "B" level or a "C" level. For this reason, in the second write operation, only a verifying operation targeted at an "A" level, or only a verifying operation targeted at an "A" level and a verifying operation targeted at a "B" level can be performed. In other words, in the second write operation, a write operation classified as phase A, a write operation classified as phase B, and a programming operation in a first loop in a write operation classified as phase C can be performed.

Meanwhile, in the second write operation, it is possible to recognize that data to be written in a certain memory cell transistor MT is at an "F" level or higher, and thus up to a verifying operation targeted at an "F" level can be performed with respect to the memory cell transistor MT. For this reason, the embodiment is not limited to the above-described example, and verifying operations targeted at a "C" level to an "F" level can be performed with respect to a memory cell transistor MT in which data at an "F" level or higher is written.

In the third write operation, verifying operations targeted at all levels including a "C" level or higher can be performed. In other words, in the third write operation, write operations in the number of loops classified as all phases can be performed.

Figure 11:
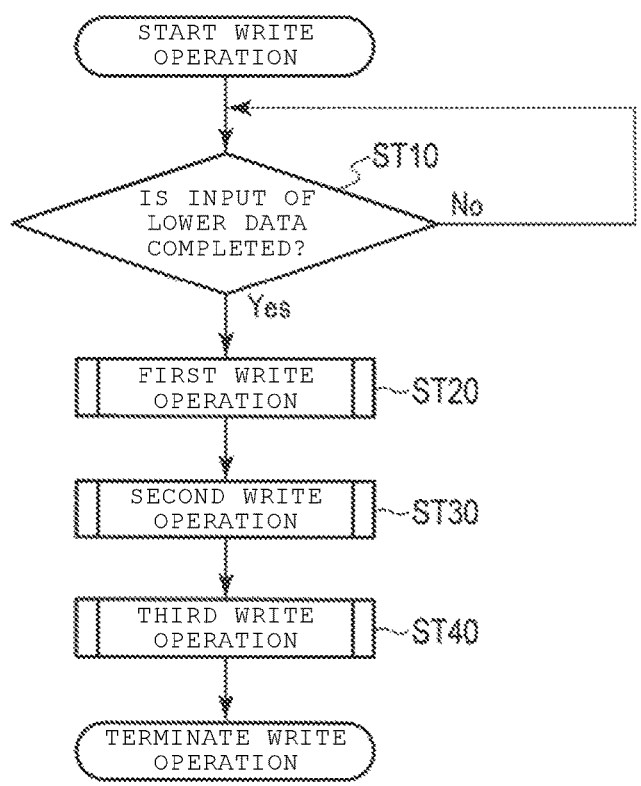
FIG. 11 is a flow chart illustrating an overall write operation which includes first, second, and third write operations, of the semiconductor memory device according to the first embodiment.
Figure 12:
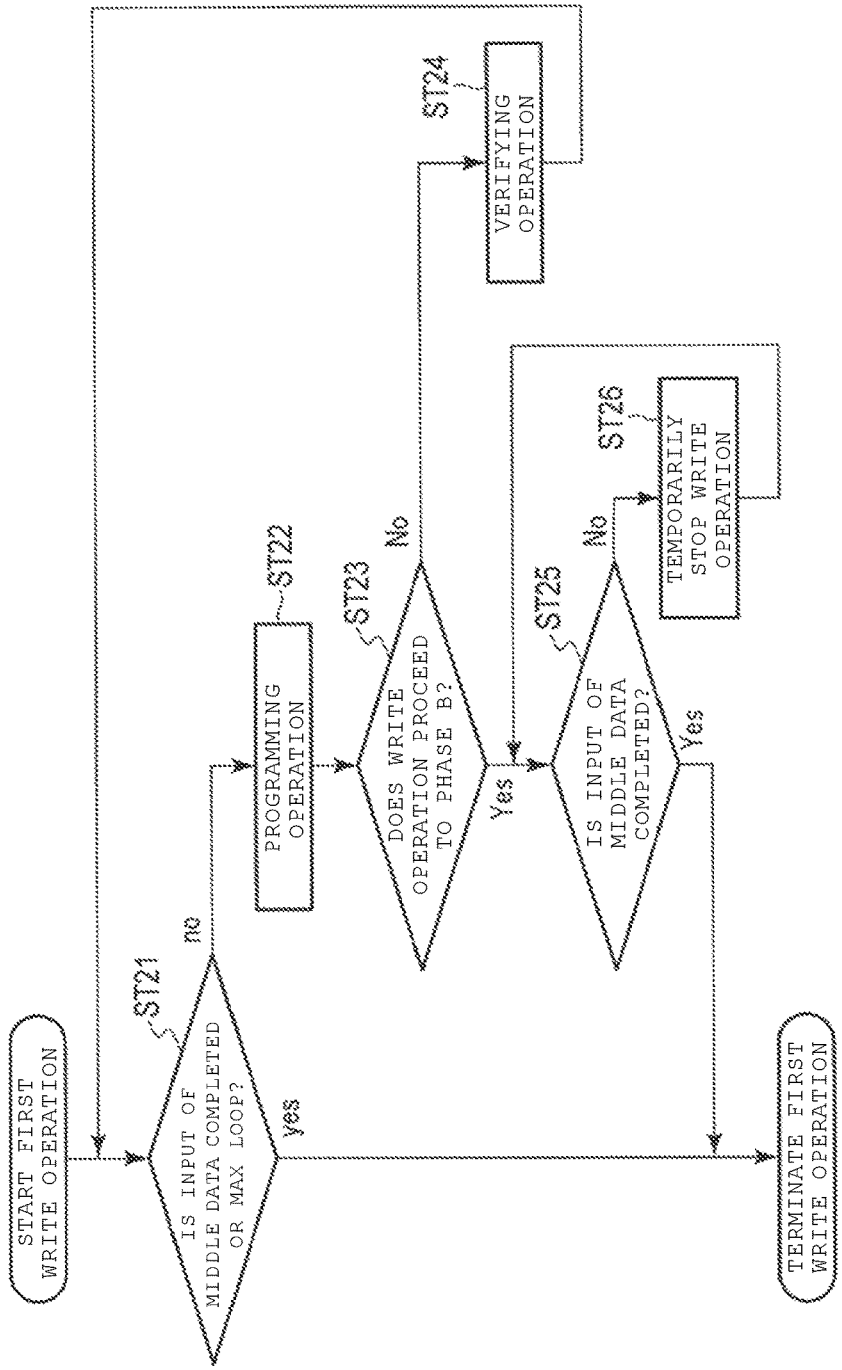
FIG. 12 is a flow chart illustrating the first write operation of the semiconductor memory device according to the first embodiment.
Figure 13:
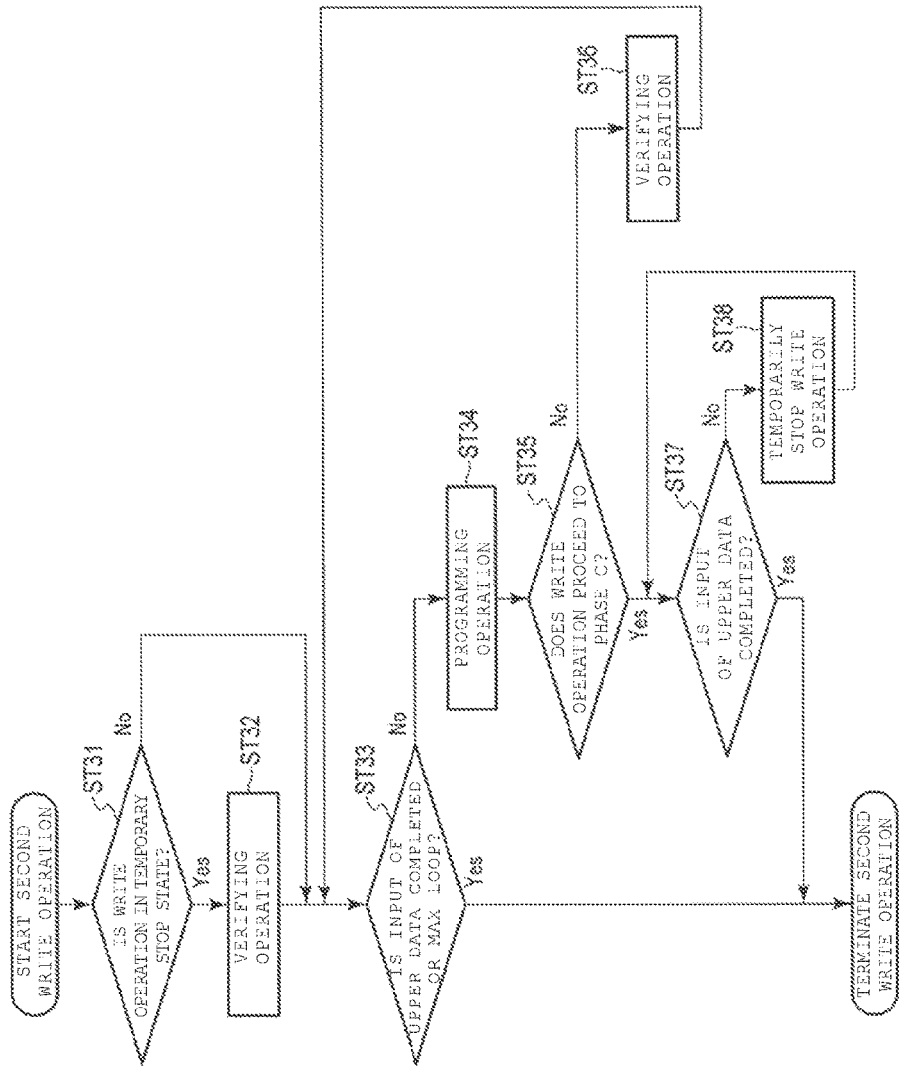
FIG. 13 is a flow chart illustrating the second write operation of the semiconductor memory device according to the first embodiment.
Figure 14:
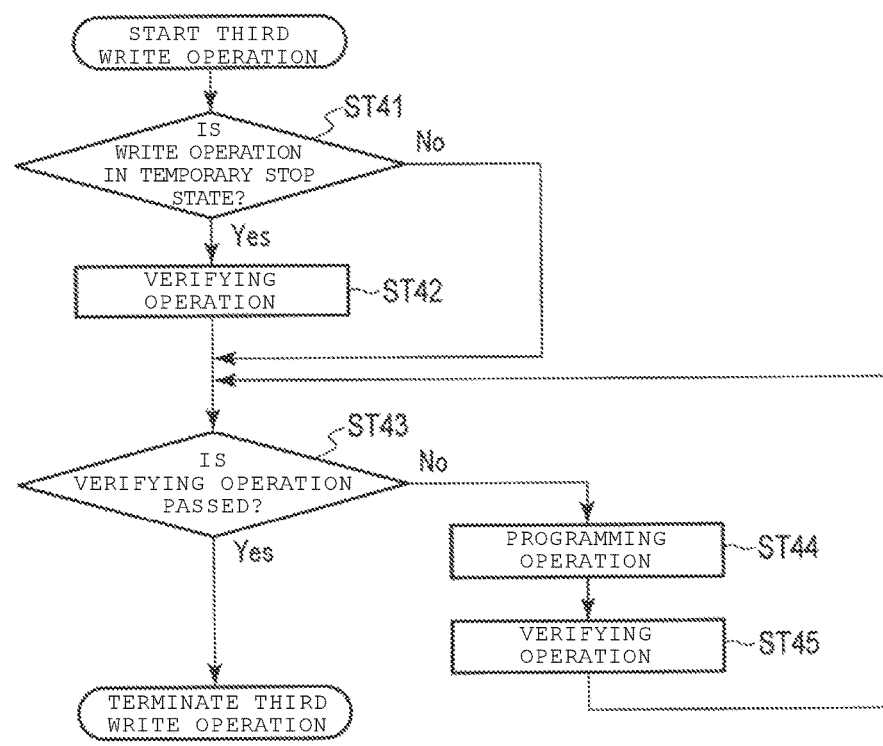
FIG. 14 is a flow chart illustrating the third write operation of the semiconductor memory device according to the first embodiment.

FIGS. 11 to 14 are flow charts illustrating a write operation of the semiconductor memory device according to the first embodiment. FIG. 11 illustrates the overall operation of a write operation, which includes first, second, and third write operations. FIG. 12 illustrates the first write operation. FIG. 13 illustrates the second write operation. FIG. 14 illustrates the third write operation.

First, the overall write operation will be described with reference to FIG. 11.

As illustrated in FIG. 11, in step ST10, the sequencer 25 determines whether or not the input of lower data is completed. When the sequencer 25 determines that the input of lower data is not completed (step ST10; no), the flow returns to step ST10. When the sequencer 25 determines that the input of lower data is completed (step ST10; yes), the flow proceeds to step ST20.

In step ST20, the sequencer 25 performs the first write operation.

In step ST30, the sequencer 25 performs the second write operation.

In step ST40, the sequencer 25 performs the third write operation.

Thereafter, the write operation is terminated.

Next, the first write operation will be described with reference to FIG. 12.

As illustrated in FIG. 12, in step ST21, the sequencer 25 determines whether or not the input of middle data is completed, or whether the maximum number of program loops (MAX LOOP) has been reached. When the sequencer 25 determines that the input of middle data is not completed and MAX LOOP has not been reached (step ST21; no), the flow proceeds to step ST22. When the sequencer 25 determines that the input of middle data is completed or MAX LOOP has been reached (step ST21; yes), the sequencer 25 terminates the first write operation.

In step ST22, the sequencer 25 performs a programming operation.

In step ST23, the sequencer 25 determines whether or not the write operation proceeds to phase B. When the sequencer 25 determines that the write operation does not proceed to the phase B, that is, determines that the write operation is phase A (step ST23; no), the flow proceeds to step ST24. When the sequencer 25 determines that the write operation proceeds to the phase B (step ST23; yes), the flow proceeds to step ST25.

In step ST24, the sequencer 25 performs a verifying operation, and then returns to step ST21. The programming operation and the verifying operation are repeatedly performed until the input of middle data is completed. Meanwhile, the verifying operation in step ST24 is performed as the first write operation, and thus a verifying operation targeted at only an "A" level is performed.

In step ST25, the sequencer 25 determines whether or not the input of middle data is completed, similar to step ST21. When the sequencer 25 determines that the input of middle data is not completed (step ST25; no), the flow proceeds to step ST26. When the sequencer 25 determines that the input of middle data is completed (step ST25; yes), the sequencer 25 terminates the first write operation.

In step ST26, the sequencer 25 temporarily stops the write operation, and then returns to step ST25. In other words, the sequencer 25 maintains the temporary stop state until the input of middle data is completed.

Thereafter, the first write operation is terminated.

Next, the second write operation will be described with reference to FIG. 13.

As illustrated in FIG. 13, in step ST31, the sequencer 25 determines whether or not the write operation is in a temporary stop state. When the sequencer 25 determines that the write operation is not in a temporary stop state (step ST31; no), the flow proceeds to step ST33. When the sequencer 25 determines that the write operation is in a temporary stop state (step ST31; yes), the flow proceeds to step ST32.

In step ST32, the sequencer 25 performs a verifying operation, and starts the write operation again. Meanwhile, the verifying operation in step ST32 is performed as the second write operation, and thus a verifying operation targeted at a "B" level may be included, in addition to a verifying operation targeted at an "A" level.

In step ST33, the sequencer 25 determines whether or not the input of upper data is completed or whether the maximum number of program loops (MAX LOOP) has been reached. When the sequencer 25 determines that the input of upper data is not completed and MAX LOOP has not been reached (step ST33; no), the flow proceeds to step ST34. When the sequencer 25 determines that the input of upper data is completed or MAX LOOP has been reached (step ST33; yes), the sequencer 25 terminates the second write operation.

In step ST34, the sequencer 25 performs a programming operation.

In step ST35, the sequencer 25 determines whether or not the write operation proceeds to phase C. When the sequencer 25 determines that the write operation does not proceed to the phase C, that is, determines that the number of loops of the write operation is phase B (step ST35; no), the flow proceeds to step ST36. When the sequencer 25 determines that the write operation proceeds to the phase C (step ST35; yes), the flow proceeds to step ST37.

In step ST36, the sequencer 25 performs the verifying operation and then returns to step ST33. The programming operation and the verifying operation are repeatedly performed until the input of upper data is completed. Meanwhile, the verifying operation in step ST36 is performed as the second write operation, and thus a verifying operation targeted at a "B" level is performed, in addition to a verifying operation targeted at an "A" level.

In step ST37, the sequencer 25 determines whether or not the input of upper data is completed, similar to step ST33. When the sequencer 25 determines that the input of upper data is not completed (step ST37; no), the flow proceeds to step ST38. When the sequencer 25 determines that the input of upper data is completed (step ST37; yes), the sequencer 25 terminates the second write operation.

In step ST38, the sequencer 25 temporarily stops the write operation, and then returns to step ST37. In other words, the sequencer 25 maintains the temporary stop state until the input of upper data is completed.

Thereafter, the second write operation is terminated.

Meanwhile, the second write operation may be skipped. Specifically, in step ST33 illustrated in FIG. 13, when the sequencer 25 determines that the input of upper data is not completed (step ST33; no), the flow may proceed to step ST38 (an arrow from step ST33 toward step ST38 is not illustrated in the drawing).

When the operation is performed in this manner, only a write operation based on only lower data is performed until the input of upper data is completed after the input of the lower data is completed. Such an operation may be applied to, for example, a case where the number of pieces of data which are input is small or a case where data is input at a high speed.

Next, the third write operation will be described with reference to FIG. 14.

As illustrated in FIG. 14, in step ST41, the sequencer 25 determines whether or not the write operation is in a temporary stop state. When the sequencer 25 determines that the write operation is not in a temporary stop state (step ST41; no), the flow proceeds to step ST43. When the sequencer 25 determines that the write operation is in a temporary stop state (step ST41; yes), the flow proceeds to step ST42.

In step ST42, the sequencer 25 performs a verifying operation, and starts the write operation again. Meanwhile, the verifying operation in step ST42 is performed as the third write operation, and thus a verifying operation targeted at a "C" level may be included, in addition to a verifying operation targeted at an "A" level and a verifying operation targeted at a "B" level.

In step ST43, the sequencer 25 determines whether or not the verifying operation is passed as a result of the verifying operation. Specifically, the sequencer 25 determines that the writing of data is not yet completed (verifying operation is failed) when an increase in threshold voltages of a certain percentage of the memory cell transistors MT is not sufficient (step ST43; no), and the flow proceeds to step ST44.

In step ST44, the sequencer 25 performs a programming operation. The sequencer 25 performs the verifying operation in step ST45, and then proceeds to step ST43 again. On the other hand, the sequencer 25 determines that desired data is written (verifying operation is passed) when the threshold voltage of the certain percentage of the memory cell transistors MT sufficiently increase (step ST43; yes), and terminates the write operation.

Thus, the third write operation is terminated, and the write operation is terminated.

1.2.3 With Regard to Write Operation when Temporary Stop is not Included

Next, a write operation of the semiconductor memory device according to the first embodiment when temporary stop is not included will be described in detail.

Figure 15:
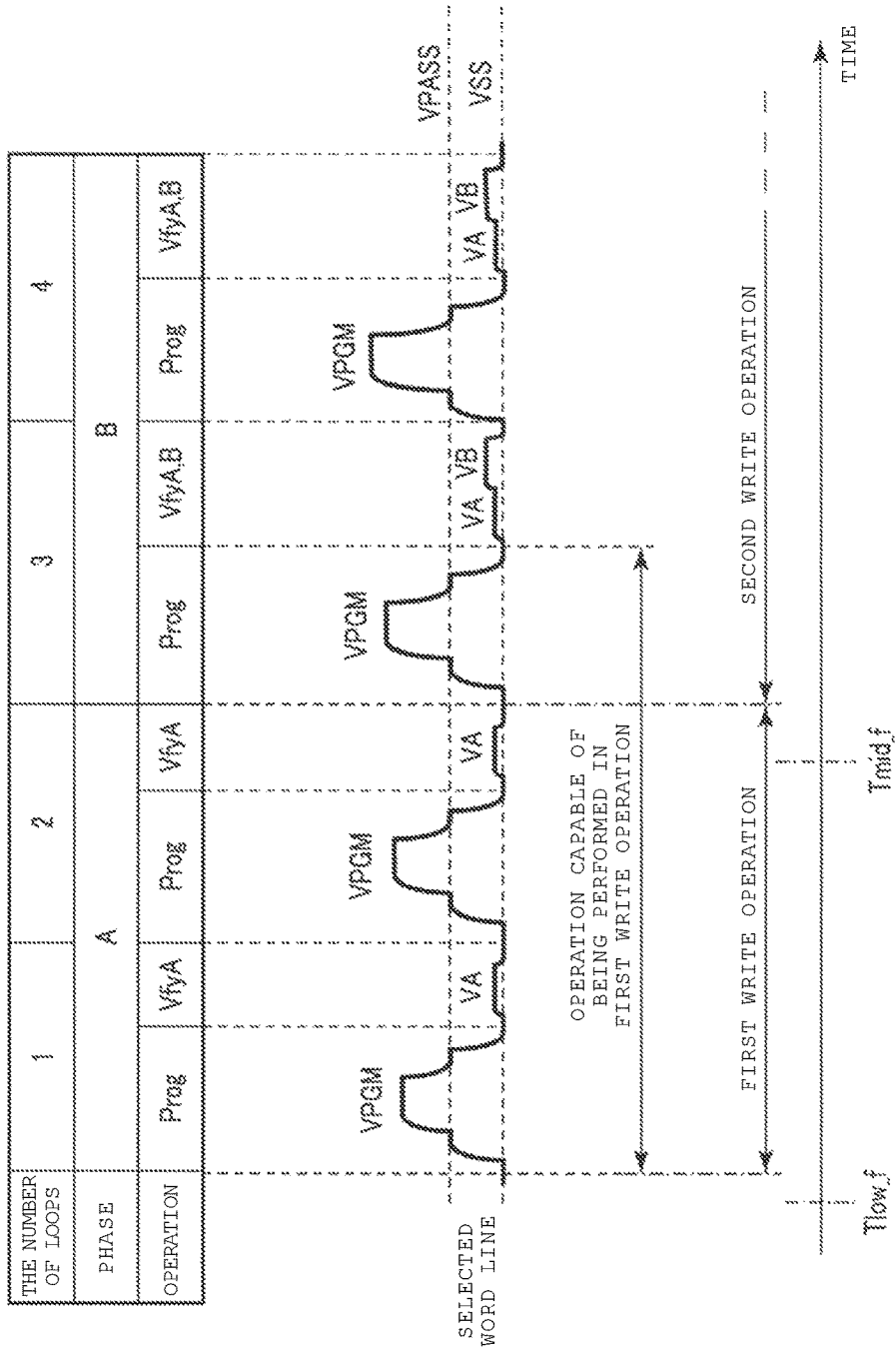
FIGS. 15 and 16 depict a timing chart illustrating a first example of a write operation of the semiconductor memory device according to the first embodiment.

1.2.3.1 With Regard to Transition from First Write Operation to Second Write Operation First, an example of operation when a write operation transitions from a first write operation to a second write operation will be described with reference to FIG. 15. FIG. 15 is a timing chart illustrating details of a write operation when temporary stop of the semiconductor memory device according to the first embodiment is not included. Meanwhile, FIG. 15 corresponds to steps ST22 to ST24 in the first write operation illustrated in FIG. 12.

As illustrated in FIG. 15, when time Tlow_f elapses, a write operation is started, and the following various types of voltages are applied to a selected word line WL as an example.

In a programming operation, voltage VPGM is applied to a selected word line WL after voltage VPASS is applied thereto, and electrons are injected into a charge storage layer 45 of a selected memory cell transistor MT. The voltage VPGM is a voltage for injecting charges into the charge storage layer 45 of the memory cell transistor MT, and is larger than the voltage VPASS. In this case, the voltage VPGM is applied to the selected word line WL. Subsequently, voltage VSS is applied to the selected word line WL, and the programming operation is terminated. Meanwhile, the voltage VPGM is gradually stepped up as the number of loops increases.

In a verifying operation, a verification voltage is applied to a selected word line WL. Regarding the verification voltage, a voltage targeted at a level varying depending on the phase is applied, as illustrated in FIG. 10. Specifically, in phase A, only voltage VA is applied in a first loop. In the first loop of phase B, voltage VA is applied, and then voltage VB is applied. Thereafter, voltage VSS is applied to the selected word line WL, and the verifying operation is terminated.

In the example of FIG. 15, time Tmid_f elapses while a verifying operation in the second loop classified as phase A is performed. In other words, the input of middle data is completed while an operation capable of being performed in the first write operation is performed. In this manner, in a case where the input of middle data is completed while an operation capable of being performed in the first write operation is performed, the sequencer 25 can perform transition to a second write operation without temporarily stopping the first write operation.

Figure 16:
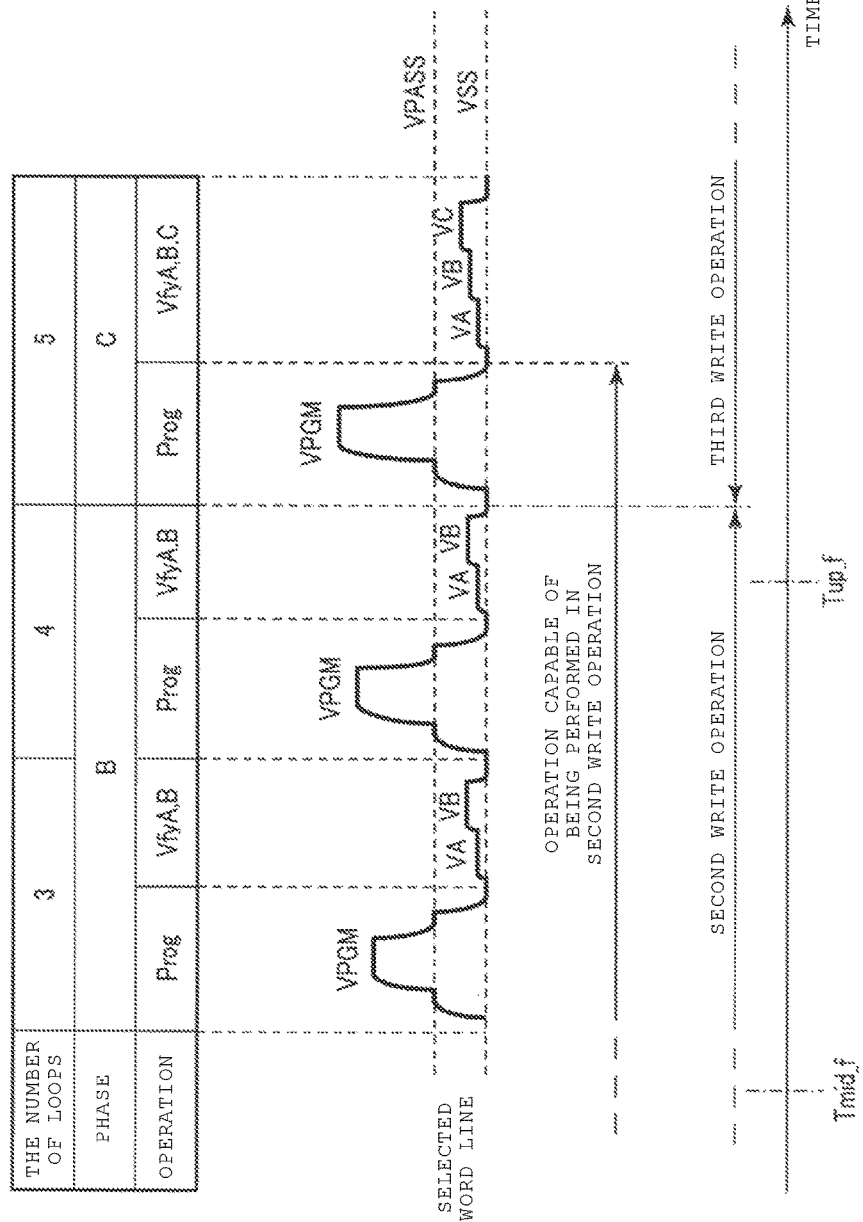

1.2.3.2 With Regard to Transition from Second Write Operation to Third Write Operation Next, an example of operation when a write operation transitions from a second write operation to a third write operation will be described with reference to FIG. 16. FIG. 16 is a timing chart illustrating details of a write operation when temporary stop of the semiconductor memory device according to the first embodiment is not included. Meanwhile, FIG. 16 corresponds to steps ST34 to ST36 in the second write operation illustrated in FIG. 13.

As illustrated in FIG. 16, when time Tmid_f elapses and a write operation is set to be in phase B, various types of voltages are applied to a selected word line WL as an example.

A programming operation is performed in the same manner as in the case illustrated in FIG. 15.

In a verifying operation, in the first loop of phase B, voltage VA is applied to the selected word line WL, and then voltage VB is applied thereto. In phase C, the voltage VA and the voltage VB are applied to the selected word line WL in the first loop, and then voltage VC is applied thereto. Thereafter, voltage VSS is applied to the selected word line WL, and the verifying operation is terminated.

In the example of FIG. 16, time Tup_f elapses while a verifying operation in a fourth loop classified as phase B is performed. In other words, the input of upper data is completed while an operation capable of being performed in a second write operation is performed. In this manner, in the case where the input of upper data is completed while an operation capable of being performed in the second write operation is performed, the sequencer 25 can perform transition to a third write operation without temporarily stopping the second write operation.

1.2.4 With Regard to Write Operation when Temporary Stop is Included

Next, a write operation of the semiconductor memory device according to the first embodiment when temporary stop is included will be described in detail.

Figure 17:
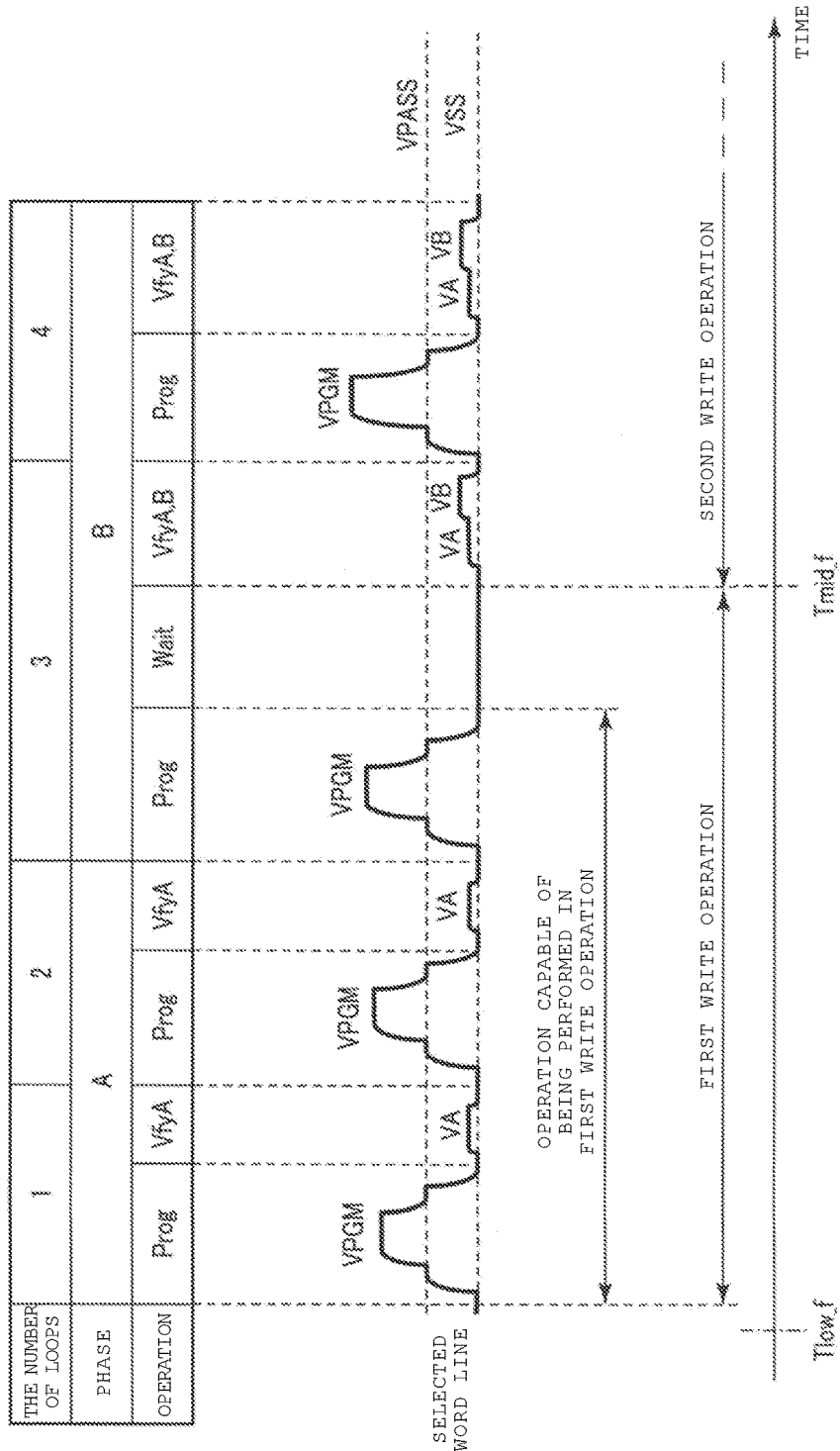
FIGS. 17 and 18 depict a timing chart illustrating a second example of a write operation of the semiconductor memory device according to the first embodiment.

1.2.4.1 With Regard to Transition from First Write Operation to Second Write Operation First, an example of operation when a write operation transitions from a first write operation to a second write operation will be described with reference to FIG. 17. FIG. 17 is a timing chart illustrating details of a write operation when temporary stop of the semiconductor memory device according to the first embodiment is included. Meanwhile, FIG. 17 corresponds to steps ST22 to ST26 in the first write operation illustrated in FIG. 12.

In the example of FIG. 17, time Tmid_f elapses after a programming operation in a third loop classified as phase B is terminated. In other words, the input of middle data is completed after an operation capable of being performed in a first write operation is terminated.

On the other hand, the sequencer 25 cannot perform transition from the first write operation to a second write operation until the input of middle data is completed. For this reason, the sequencer 25 temporarily stops the write operation (denoted by Wait in FIG. 17) until the input of middle data is completed after the operation capable of being performed in the first write operation is completed. In the example of FIG. 17, the sequencer 25 temporarily stops the first write operation until the input of middle data is completed after the programming operation in the third loop is terminated. The sequencer 25 rapidly performs the second write operation starting from a verifying operation in the third loop after the input of middle data is completed.

Figure 18:
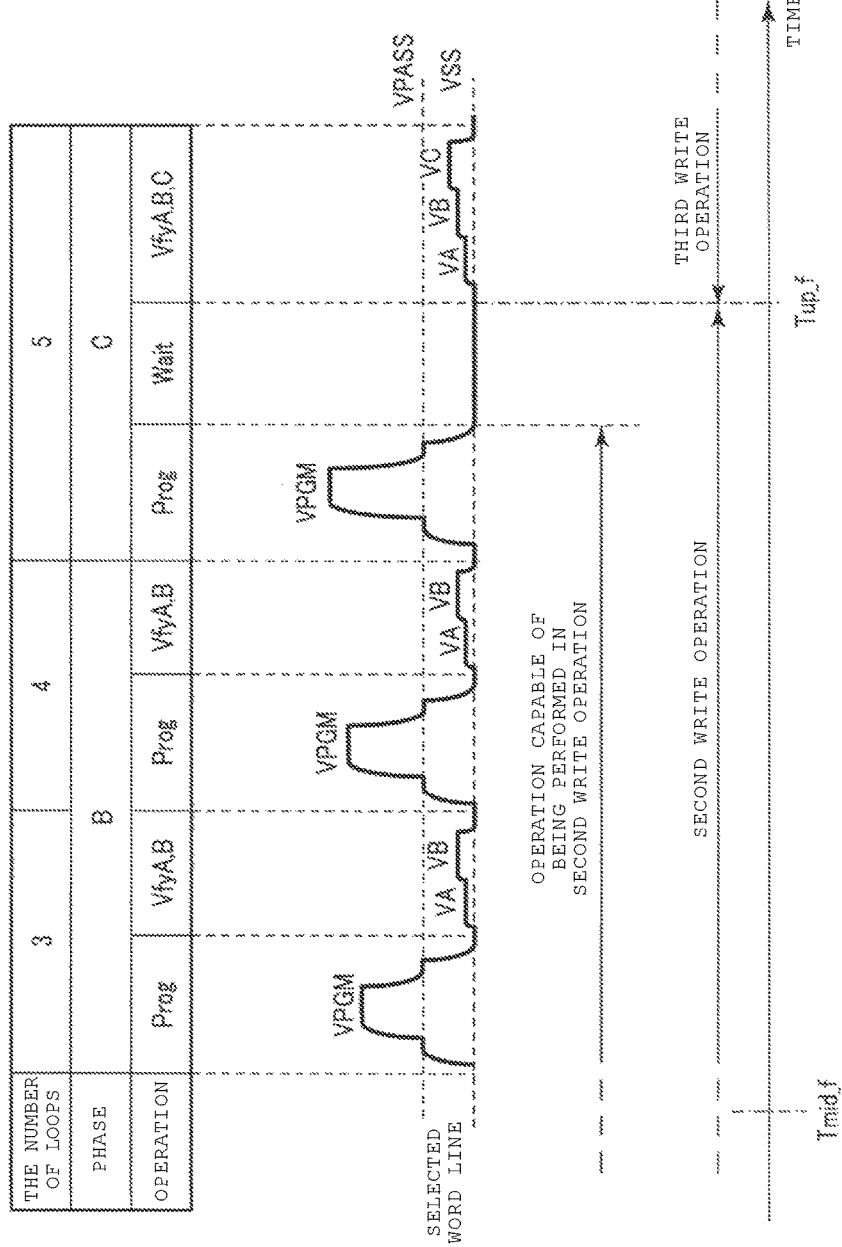

1.2.4.2 With Regard to Transition from Second Write Operation to Third Write Operation Next, an example of operation when a write operation transitions from a second write operation to a third write operation will be described with reference to FIG. 18. FIG. 18 is a timing chart illustrating details of a write operation when temporary stop of the semiconductor memory device according to the first embodiment is included. Meanwhile, FIG. 18 corresponds to steps ST34 to ST38 in the second write operation illustrated in FIG. 13.

In the example of FIG. 18, time Tup_f elapses after a programming operation in a fourth loop classified as phase C is terminated. In other words, the input of upper data is completed after an operation capable of being performed in the second write operation is terminated.

On the other hand, the sequencer 25 cannot perform transition from the second write operation to the third write operation until the input of upper data is completed. For this reason, the sequencer 25 temporarily stops the write operation (denoted by Wait in FIG. 18) until the input of upper data is completed after an operation capable of being performed in the second write operation is completed. In the example of FIG. 18, the sequencer 25 temporarily stops the second write operation until the input of upper data is completed after a programming operation in a fourth loop is terminated. The sequencer 25 rapidly performs the third write operation starting from a verifying operation in a fifth loop after the input of upper data is completed.

1.2.5 With Regard to Operation of Latch Circuit

Next, the operation of a latch circuit in a write operation of the semiconductor memory device according to the first embodiment will be described. FIGS. 19 to 23 are tables illustrating the operation of the latch circuit in the write operation of the semiconductor memory device according to the first embodiment. FIGS. 19 to 23 illustrate pieces of data which are input to latch circuits SDL, ADL, BDL, and CDL that are respectively connected to memory cell transistors MT having target threshold voltage levels of an "Er" level to a "G" level. In addition, FIG. 20, FIG. 21, FIG. 22, and FIG. 23 illustrate changes from FIG. 19, FIG. 20, FIG. 21, and FIG. 22, respectively.

Meanwhile, in the following description, it is assumed that lower data, middle data, and upper data are respectively input to the latch circuits ADL, BDL, and CDL, as an example. In addition, in the following description, a latch circuit Y (Y is SDL, ADL, BDL, or CDL), which is connected to a memory cell transistor MT in which an "X" level (X is Er or A to G) is to be written as a certain target threshold voltage level, is denoted by Yx (x is a lower-case letter of X) as necessary. For example, the latch circuit ADL connected to a memory cell transistor MT having a target threshold voltage level of an "Er" level is denoted by a latch circuit ADLer, and the latch circuit CDL connected to a memory cell transistor MT having a target threshold voltage level of an "E" level is denoted by a latch circuit CDLe.

FIG. 19 illustrates an example of a state where the input of lower data is completed and a state immediately after a first write operation is started. When the input of lower data is completed, the first write operation is started. Meanwhile, meaningful data is not input to the latch circuits BDL and CDL during the first write operation. In particular, middle data is in the course of being input to the latch circuit BDL, but the input of all pieces of data is not completed. For this reason, the latch circuits BDL and CDL do not contribute to the first write operation (denoted by NA (not activated) in FIG. 19).

Meanwhile, in a write operation, it is determined whether or not writing to a memory cell transistor MT is performed, in accordance with, for example, data of the latch circuit SDL. Specifically, the sequencer 25 performs the writing of data in a memory cell transistor MT connected to the latch circuit SDL when data of the latch circuit SDL is "1". On the other hand, when the data of the latch circuit SDL is "0", writing of data in the memory cell transistor MT connected to the latch circuit SDL is not performed.

As described above, an "E" level to a "G" level cannot be distinguished from an "Er" level with only lower data. For this reason, in the first write operation, an "Er" level as an apparent target threshold voltage level is set in memory cell transistors MT each having a target threshold voltage level of one of "Er" level and an "E" level to a "G" level. Accordingly, "1" is input to latch circuits SDLer, SDLe, SDLf, and SDLg.

In addition, as described above, a "B" level to a "D" level cannot be distinguished from an "A" level. For this reason, in the first write operation, an "A" level as an apparent target threshold voltage level is set in memory cell transistors MT each having a target threshold voltage level of one of an "A" level to a "D" level. Accordingly, "0" is input to latch circuits SDLa, SDLb, SDLc, and SDLd. Thereby, in the first write operation, a programming operation and a verifying operation targeted at an "A" level are performed on memory cell transistors MT each having a target threshold voltage level of one of "A" to "D" levels.

Meanwhile, the input to the latch circuit SDL in the first write operation is realized by transmitting, for example, data, which has been input to the latch circuit ADL, to the latch circuit SDL.

FIG. 20 illustrates a state when a verifying operation targeted at an "A" level is passed with respect to memory cell transistors MT having target threshold voltage levels of a "B" level and a "D" level, as an example. As illustrated in FIG. 20, in the memory cell transistors MT respectively having target threshold voltage levels of a "B" level and a "D" level, an apparent target threshold voltage level is set to be an "A" level, and thus it is determined that writing is completed. Accordingly, latch circuits SDLb and SDLd are updated from "0" to "1". Meanwhile, "0" is subsequently held in other latch circuit SDLa and SDLc having an apparent target threshold voltage level of an "A" level.

FIG. 21 illustrates an example of a state where the operation of a second write operation is started after the input of middle data is completed. Meanwhile, upper data is in the process of being input to the latch circuit CDL during the second write operation, but the input of all pieces of data is not completed. For this reason, the latch circuit CDL does not contribute to the second write operation (denoted by NA in FIG. 21).

As described above, an "E" level cannot be distinguished from an "Er" level with only lower data and middle data. For this reason, in the second write operation, an "Er" level as an apparent target threshold voltage level is subsequently set in a memory cell transistor MT having a target threshold voltage level of an "E" level. Accordingly, "1" is subsequently held in the latch circuit SDLe.

On the other hand, an "F" level and a "G" level are distinguished from an "Er" level by the input of middle data. For this reason, the latch circuits SDLf and SDLg are updated from "1" to "0". Meanwhile, a "G" level cannot be distinguished from an "F" level with only lower data and middle data. For this reason, in the second write operation, an "F" level as an apparent target threshold voltage level is set in a memory cell transistor MT having a target threshold voltage level of a "G" level.

In addition, as described above, a "D" level cannot be distinguished from an "A" level with only lower data and middle data. For this reason, in the second write operation, an "A" level as an apparent target threshold voltage level is subsequently set in a memory cell transistor MT having a target threshold voltage level of a "D" level. In the example of FIG. 21, the memory cell transistor MT having a target threshold voltage level of a "D" level passes a verifying operation targeted at an "A" level, and thus "1" is subsequently held in the latch circuit SDLd. In addition, a memory cell transistor MT having a target threshold voltage level of an "A" level does not yet pass a verifying operation targeted at an "A" level, and thus "0" is subsequently held in the latch circuit SDLa.

On the other hand, a "B" level and a "C" level are distinguished from an "A" level by the input of middle data. For this reason, the latch circuit SDLb is updated from "1" to "0", and "0" is subsequently held in the latch circuit SDLc. Meanwhile, a "C" level cannot be distinguished from a "B" level with only lower data and middle data. For this reason, in the second write operation, a "B" level as an apparent target threshold voltage level is set in a memory cell transistor MT having a target threshold voltage level of a "C" level.

Thereby, in the second write operation, a programming operation and a verifying operation targeted at an "A" level are performed on memory cell transistors MT respectively having target threshold voltage levels of "A" to "D" levels. In addition, a programming operation and a verifying operation targeted at a "B" level are performed on memory cell transistors MT respectively having target threshold voltage levels of a "B" level and a "C" level. In addition, a programming operation is performed on memory cell transistors MT respectively having target threshold voltage levels of an "F" level and a "G" level.

FIG. 22 illustrates a state when a verifying operation targeted at an "A" level is passed with respect to a memory cell transistor MT having a target threshold voltage level of an "A" level and a verifying operation targeted at a "B" level is passed with respect to a memory cell transistor MT having a target threshold voltage level of a "C" level, as an example.

As illustrated in FIG. 22, it is determined that writing is completed with respect to a memory cell transistor MT having a target threshold voltage level of an "A" level. Accordingly, the latch circuit SDLa is updated from "0" to "1". In addition, an apparent target threshold voltage level is set to be a "B" level in a memory cell transistor MT having a target threshold voltage level of a "C" level, and thus it is determined that writing is completed. Accordingly, the latch circuit SDLc is updated from "0" to "1".

Meanwhile, "0" is subsequently held in the latch circuit SDLb having a target threshold voltage level of a "B" level and the latch circuits SDLf and SDLg having an apparent target threshold voltage levels of an "F" level.

FIG. 23 illustrates an example of a state where the operation of a third write operation is started after the input of upper data is completed. In FIG. 23, the input of all pieces of data of lower data, middle data, and upper data is completed, and thus a target threshold voltage level is set in all of the memory cell transistors MT.

As described above, all of the pieces of data are input, and thus a "D" level can be distinguished from an "A" level, and an "E" level can be distinguished from an "Er" level. Accordingly, the latch circuits SDLd and SDLe are updated from "1" to "0".

In addition, as described above, all of the pieces of data are input, and thus a "C" level is distinguished from a "B" level. For this reason, the latch circuit SDLc is updated from "1" to "0", and "0" is subsequently held in the latch circuit SDLb.

Meanwhile, in the subsequent write operations, the sequencer 25 perform control so that the logical product of the latch circuits ADL, BDL, and CDL is set to "1" when the final writing is completed and is set to "0" when the final writing is not completed. In other words, when writing for a memory cell transistor MT having a certain target threshold voltage level is completed, the values of the latch circuits ADL, BDL, and CDL are updated so that an apparent target threshold voltage level of the memory cell transistor MT is set to be an "Er" level. In the example of FIG. 23, a memory cell transistor MT having a target threshold voltage level of an "A" level passes a verifying operation targeted at an "A" level, and thus the final writing is completed. Accordingly, the latch circuit ADLa is updated from "0" to "1". In addition, "1" is input to the latch circuit SDLa as the logical product of the latch circuits ADLa, BDLa, and CDLa.

Regarding the subsequent write operations, the value of a latch circuit is updated similar to the above-described operation, and write operations for all of the memory cell transistors MT are finally terminated.

1.3 Effects According to this Embodiment

A semiconductor memory device may be configured such that data of a plurality of bits is held in one memory cell transistor. When data is written in a memory cell transistor capable of holding data of a plurality of bits, data to be written in the memory cell transistor is input to the semiconductor memory device from an external controller a plurality of times. The data to be written in the memory cell transistor is not uniquely specified until all pieces of data are input. For this reason, a write operation is not generally started until all pieces of data are input.

According to the first embodiment, when the sequencer 25 receives a set of commands "01h", "80h", and "16h", lower data is input to a latch circuit ADL. The sequencer 25 performs a first write operation based on lower data before the input of middle data is completed after the input of the lower data is completed. Thereby, it is possible to perform a portion of a write operation in advance before the input of middle data and upper data is completed.

Specifically, in a first write operation, the sequencer 25 regards a memory cell transistor MT, which is a target for writing, as a memory cell transistor in which data of one bit based on only lower data is written. In other words, in the first write operation, the sequencer 25 does not distinguish a memory cell transistor MT having a target threshold voltage level of an "Er" level and memory cell transistors MT respectively having target threshold voltage levels of an "E" level to a "G" level from each other. Thereby, the sequencer 25 does not perform writing on the memory cell transistors MT respectively having target threshold voltage levels of an "E" level to a "G" level which are not distinguishable from the memory cell transistor MT having a target threshold voltage level of an "Er" level. This is because the "E" level to the "G" level are higher than the "Er" level, and thus it is not possible to increase a threshold voltage of the memory cell transistor MT before it is decided whether a target threshold voltage level is an "Er" level or "E" to "G" levels. In addition, in the first write operation, memory cell transistors MT respectively having target threshold voltage levels of an A" level to a "D" level are not distinguished from each other. Thereby, the sequencer 25 can perform writing until memory cell transistors MT respectively having target threshold voltage levels of "A" to "D" levels pass at least a verifying operation targeted at an "A" level which is the lowest level. This is because the "B" level to the "D" level are higher than the "A" level, and thus it is known that it is necessary to increase a threshold voltage up to the "A" level or higher in any of the memory cell transistors MT even before it is decided whether a target threshold voltage level is the "A" level or the "B" level to the "D" level. In this manner, the sequencer 25 can perform a portion of a write operation until the input of middle data is completed and to reduce a time required for the entire write operation.

Meanwhile, in the first write operation, it is not possible to distinguish a memory cell transistor MT having a target threshold voltage level of an "A" level and a memory cell transistor MT having a target threshold voltage level of a "B" level from each other. For this reason, it is not possible to perform a verifying operation targeted at a "B" level. According to the first embodiment, when all memory cell transistors MT capable of performing a verifying operation targeted at an "A" level pass until the input of middle data is completed, the sequencer 25 temporarily stops the first write operation. Thereby, it is possible to suppress the writing of data of a "B" level or higher with respect to a memory cell transistor MT in which an "A" level is to be originally written.

In addition, when the sequencer 25 receives a set of commands "02h", "80h", and "16h", middle data is input to a latch circuit BDL. The sequencer 25 performs a second write operation based on lower data and middle data before the input of upper data is completed after the input of the middle data is completed. Thereby, it is possible to further perform a portion of a write operation in advance before the input of the upper data is completed.

Specifically, in the second write operation, the sequencer 25 regards a memory cell transistor MT, which is a target for writing, as a memory cell transistor in which data of two bits based on only lower data and middle data is written. In other words, in the second write operation, the sequencer does not distinguish memory cell transistors MT, respectively having target threshold voltage levels of an "Er" level and an "E" level, from each other. Thereby, the sequencer 25 does not perform writing on a memory cell transistor MT having a target threshold voltage level of an "E" level which is not distinguishable from a memory cell transistor MT having a target threshold voltage level of an "Er" level. In addition, the sequencer does not distinguish memory cell transistors MT, respectively having target threshold voltage levels of an "A" level and a "D" level, from each other. Thereby, the sequencer 25 can perform writing on the memory cell transistor MT having a target threshold voltage level of a "D" level until the memory cell transistor passes at least a verifying operation targeted at an "A" level. In addition, the sequencer does not distinguish memory cell transistors MT, respectively having target threshold voltage levels of a "B" level and a "C" level, from each other. Thereby, the sequencer 25 can perform writing on the memory cell transistors MT, respectively having target threshold voltage levels of a "B" level and a "C" level, until the memory cell transistors pass at least a verifying operation targeted at a "B" level. In addition, the sequencer does not distinguish memory cell transistors MT, respectively having target threshold voltage levels of an "F" level and a "G" level, from each other. Thereby, the sequencer 25 can perform writing on the memory cell transistors MT, respectively having target threshold voltage levels of an "F" level and a "G" level, until the memory cell transistors pass at least a verifying operation targeted at an "F" level. In this manner, the sequencer 25 can further perform a portion of a write operation in addition to the first write operation, until the input of upper data is completed after the input of middle data is completed, and can reduce a time required for the entire write operation.

Meanwhile, in the second write operation, it is not possible to perform a verifying operation targeted at a "C" level on a memory cell transistor MT having a target threshold voltage level of a "B" level or a "C" level. For this reason, when a verifying operation targeted at a "B" level is passed with respect to the memory cell transistor MT having a target threshold voltage level of a "B" level or a "C" level until the input of upper data is completed, the sequencer 25 temporarily stops the second write operation. Thereby, it is possible to suppress the writing of data of a "C" level or higher with respect to a memory cell transistor MT in which a "B" level is to be originally written.

2. Second Embodiment

Next, a semiconductor memory device according to a second embodiment will be described. In the second embodiment, a threshold voltage of a memory cell transistor is increased up to a certain intended level after the relevant input of a portion of data is completed, while avoiding an increase in a threshold voltage up to an unintended level. Specifically, as a first write operation, a write operation of increasing a threshold voltage is performed to such an extent that writing is not performed up to a "B" level with respect to memory cell transistors MT respectively having target threshold voltage levels of an "A" level to a "D" level. In addition, as a second write operation, a write operation of increasing a threshold voltage is performed to such an extent that writing is not performed up to a "C" level with respect to memory cell transistors MT respectively having target threshold voltage levels of a "B" level and a "C" level, and a write operation of increasing a threshold voltage is performed to such an extent that writing is not performed up to a "G" level with respect to memory cell transistors MT respectively having target threshold voltage levels of an "F" level and a "G" level. As a third write operation, a write operation of increasing a threshold voltage is performed to such an extent that writing is not performed up to an "E" level with respect to memory cell transistors MT respectively having target threshold voltage levels of a "D" level and an "E" level before a normal write operation is performed. Hereinafter, the same components as those in the first embodiment will be denoted by the same reference numerals and signs, and a description thereof will not be repeated. Only portions different from the first embodiment will be described.

2.1 With Regard to Write Operation

A write operation of the semiconductor memory device according to the second embodiment will be described.

2.1.1 With Regard to Outline of Write Operation

An outline of a write operation according to the second embodiment will be simply described.

Figure 24:
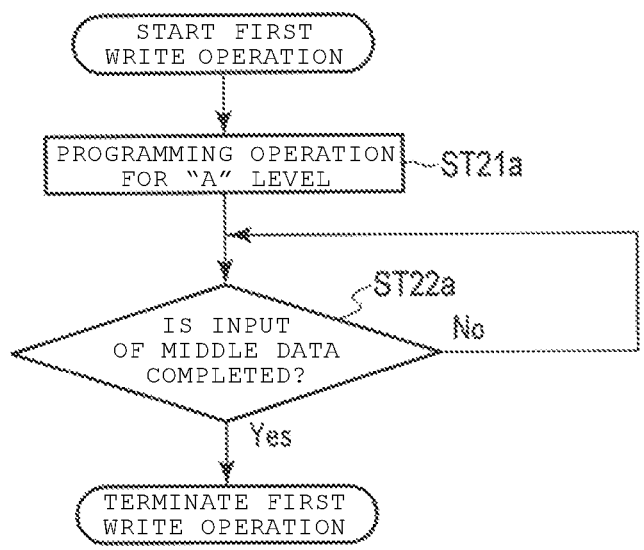
FIG. 24 is a flow chart illustrating a first write operation of a semiconductor memory device according to a second embodiment.
Figure 25:
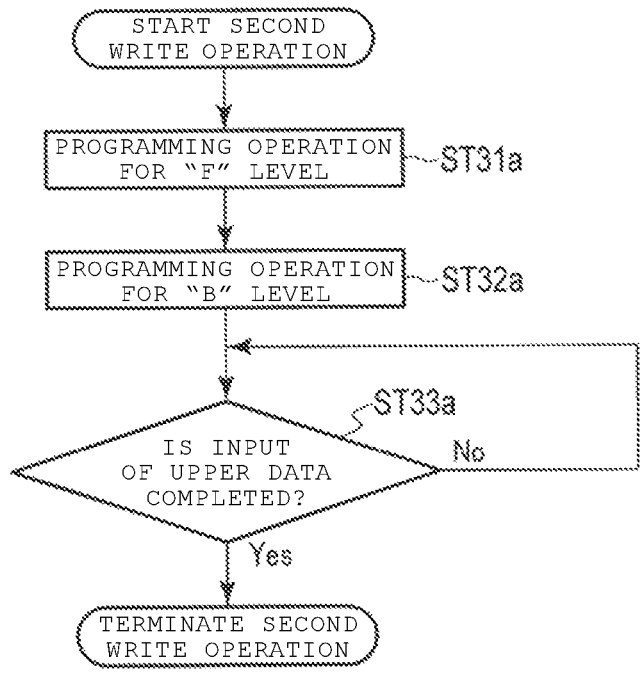
FIG. 25 is a flow chart illustrating a second write operation of the semiconductor memory device according to the second embodiment.
Figure 26:
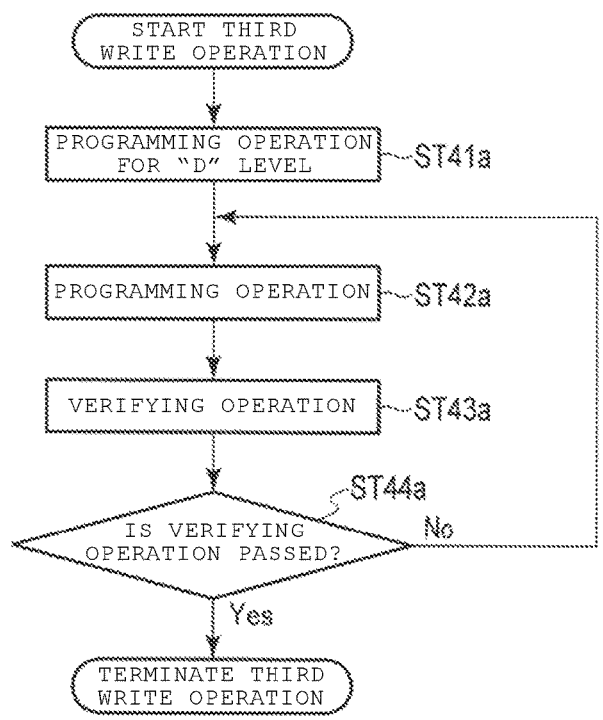
FIG. 26 is a flow chart illustrating a third write operation of the semiconductor memory device according to the second embodiment.

FIGS. 24 to 26 are flow charts illustrating a write operation of the semiconductor memory device according to the second embodiment. FIG. 24 illustrates a first write operation in the write operation according to the second embodiment. FIG. 25 illustrates a second write operation in the write operation according to the second embodiment. FIG. 26 illustrates a third write operation in the write operation according to the second embodiment.

First, the first write operation will be described with reference to FIG. 24.

As illustrated in FIG. 24, a sequencer 25 performs a programming operation for an "A" level in step ST21a. The programming operation for an "A" level is a programming operation of increasing a threshold voltage of a memory cell transistor MT so that the threshold voltage approaches voltage VA. The programming operation for an "A" level is performed on memory cell transistors MT respectively having target threshold voltage levels of an "A" level to a "D" level.

In step ST22a, the sequencer 25 determines whether or not the input of middle data is completed. When the sequencer 25 determines that the input of middle data is not completed (step ST22a; no), the flow returns to step ST52. When the sequencer 25 determines that the input of middle data is completed (step ST22a; yes), the sequencer 25 terminates the first write operation.

Next, a second write operation will be described with reference to FIG. 25.

As illustrated in FIG. 25, the sequencer 25 performs a programming operation for an "F" level in step ST31a. The programming operation for an "F" level is a programming operation of increasing a threshold voltage of a memory cell transistor MT so that the threshold voltage approaches voltage VF. The programming operation for an "F" level is performed on memory cell transistors MT respectively having target threshold voltage levels of an "F" level and a "G" level.

In step ST32a, the sequencer 25 performs a programming operation for a "B" level. The programming operation for a "B" level is a programming operation of increasing a threshold voltage of a memory cell transistor MT so that the threshold voltage approaches voltage VB. The programming operation for a "B" level is performed on memory cell transistors MT respectively having target threshold voltage levels of a "B" level and a "C" level.

In step ST33a, the sequencer 25 determines whether or not the input of upper data is completed. When the sequencer 25 determines that the input of upper data is not completed (step ST33a; no), the flow returns to step ST63. When the sequencer 25 determines that the input of upper data is completed (step ST33a; yes), the sequencer 25 terminates the second write operation.

Meanwhile, in the example of FIG. 25, the programming operation for an "F" level is performed prior to the programming operation for a "B" level, but the programming operations can be performed in any order. For example, the programming operation for an "F" level may be performed after the programming operation for a "B" level.

Next, a third write operation will be described with reference to FIG. 26.

As illustrated in FIG. 26, the sequencer 25 performs a programming operation for a "D" level in step ST41a. The programming operation for a "D" level is a programming operation of increasing a threshold voltage of a memory cell transistor MT so that the threshold voltage approaches voltage VD. The programming operation for a "D" level is performed on memory cell transistors MT respectively having target threshold voltage levels of a "D" level and an "E" level.

In step ST42a, the sequencer 25 performs a programming operation.

In step ST43a, the sequencer 25 performs a verifying operation.

In step ST44a, the sequencer 25 determines whether or not the verifying operation is passed as a result of the verifying operation. Specifically, the sequencer 25 determines that the verifying operation is failed when an increase in threshold voltages of a certain percentage of the memory cell transistors MT is not sufficient (step ST44a; no), and the flow proceeds to step ST42a. On the other hand, the sequencer 25 determines that the verifying operation is passed when the threshold voltages of the certain percentage of the memory cell transistors MT sufficiently increase (step ST44a; yes), and terminates the third write operation.

Thus, the write operation is terminated.

2.1.2 With Regard to Timing Chart

Figure 27:
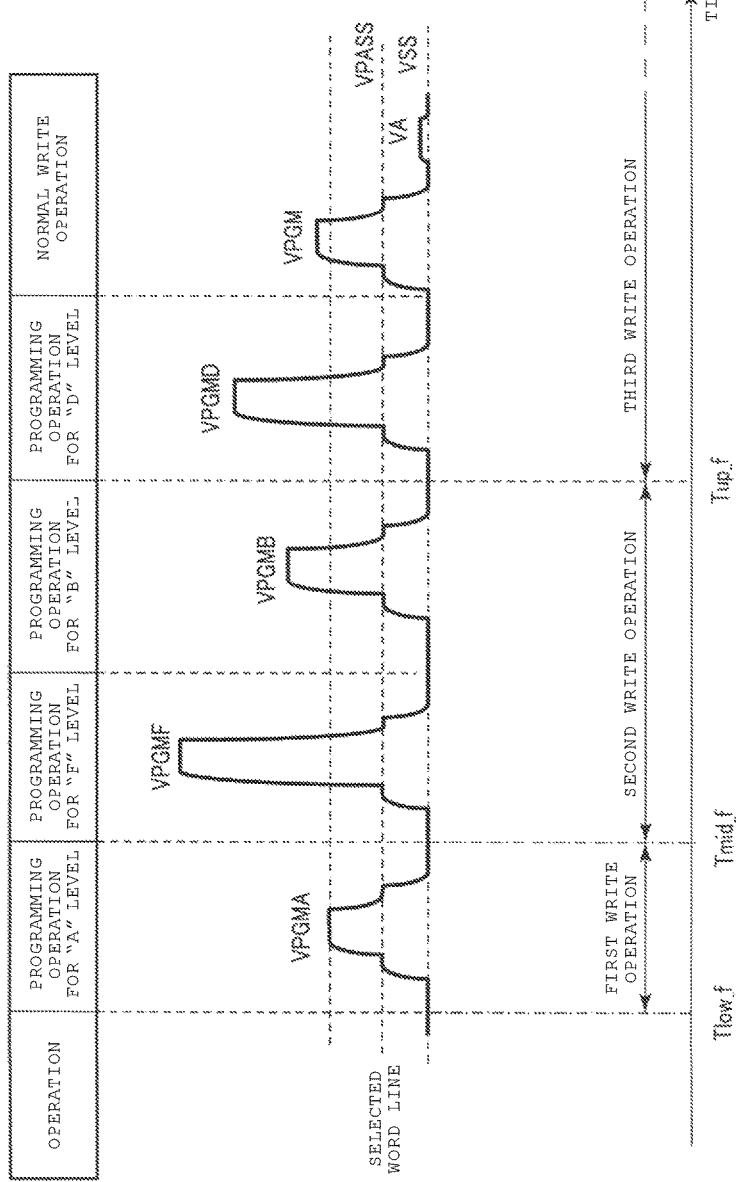
FIG. 27 is a timing chart illustrating a write operation of the semiconductor memory device according to the second embodiment.

Next, a timing chart in a write operation of the semiconductor memory device according to the second embodiment will be described with reference to FIG. 27. FIG. 27 is a timing chart illustrating a write operation of the semiconductor memory device according to the second embodiment.

First, a timing chart in a first write operation will be described. As illustrated in FIG. 27, when time Tlow_f elapses, a first write operation is started, and the following various types of voltages are applied to a selected word line WL as an example.

A programming operation for an "A" level increases threshold voltages of memory cell transistors MT respectively having target threshold voltage levels of an "A" level to a "D" level by a write voltage VPGMA applied to a selected word line WL. Specifically, in the programming operation for an "A" level, voltage VPGMA is applied to the selected word line WL after voltage VPASS is applied thereto, and electrons are injected into a charge storage layer 45 of a selected memory cell transistor MT. The voltage VPGMA is a voltage for injecting charges into the charge storage layer 45 of the memory cell transistor MT, and is larger than the voltage VPASS. In addition, the voltage VPGMA has such a magnitude as to bring a threshold voltage of a memory cell transistor MT, which is a target for writing, close to voltage VA. Thereafter, voltage VPASS is applied to the selected word line WL. Subsequently, voltage VSS is applied to the selected word line WL, and the programming operation for an "A" level is terminated.

In addition, the first write operation may or may not include a verifying operation.

Next, a timing chart in a second write operation will be subsequently described with reference to FIG. 27. When time Tmid_f elapses, a second write operation is started, and the following various types of voltages are applied to a selected word line WL as an example.

A programming operation for an "F" level increases threshold voltages of memory cell transistors MT respectively having target threshold voltage levels of an "F" level and a "G" level by a write voltage applied to a selected word line WL. Specifically, in the programming operation for an "F" level, voltage VPGMF is applied to the selected word line WL after voltage VPASS is applied thereto, and electrons are injected into a charge storage layer 45 of a selected memory cell transistor MT. The voltage VPGMF is a voltage for injecting charges into the charge storage layer 45 of the memory cell transistor MT, and is larger than the voltage VPASS. In addition, the voltage VPGMF has such a magnitude as to bring a threshold voltage of a memory cell transistor MT, which is a target for writing, close to voltage VF. Thereafter, voltage VPASS is applied to the selected word line WL. Subsequently, voltage VSS is applied to the selected word line WL, and the programming operation for an "F" level is terminated.

A programming operation for a "B" level increases threshold voltages of memory cell transistors MT respectively having target threshold voltage levels of a "B" level and a "C" level by a write voltage applied to a selected word line WL. Specifically, in the programming operation for a "B" level, voltage VPGMB is applied to the selected word line WL after voltage VPASS is applied thereto, and electrons are injected into a charge storage layer 45 of a selected memory cell transistor MT. The voltage VPGMB is a voltage for injecting charges into the charge storage layer 45 of the memory cell transistor MT, and is larger than the voltage VPASS. In addition, the voltage VPGMB has such a magnitude as to bring a threshold voltage of a memory cell transistor MT, which is a target for writing, close to voltage VB. Thereafter, voltage VPASS is applied to the selected word line WL. Subsequently, voltage VSS is applied to the selected word line WL, and the programming operation for a "B" level is terminated.

In addition, the second write operation may or may not include a verifying operation.

Next, a timing chart in a third write operation will be subsequently described with reference to FIG. 27. When time Tup_f elapses, a third write operation is started, and the following various types of voltages are applied to a selected word line WL as an example.

A programming operation for a "D" level increases threshold voltages of memory cell transistors MT respectively having target threshold voltage levels of a "D" level and an "E" level by a write voltage applied to a selected word line WL. Specifically, in the programming operation for a "D" level, voltage VPGMD is applied to the selected word line WL after voltage VPASS is applied thereto, and electrons are injected into a charge storage layer 45 of a selected memory cell transistor MT. The voltage VPGMD is a voltage for injecting charges into the charge storage layer 45 of the memory cell transistor MT, and is larger than the voltage VPASS. In addition, the voltage VPGMD has such a magnitude as to bring a threshold voltage of a memory cell transistor MT, which is a target for writing, close to voltage VD. Thereafter, voltage VPASS is applied to the selected word line WL. Subsequently, voltage VSS is applied to the selected word line WL, and the programming operation for a "D" level is terminated.

In addition, the third write operation may or may not include a verifying operation until a normal write operation is started.

After the programming operation for a "D" level is performed, a normal write operation is performed. The normal write operation includes performing a programming operation and a verifying operation in each loop until reaching a decided target threshold voltage level. In the programming operation, voltage VPGM is applied as a write voltage. As the voltage VPGM, for example, a voltage which is stepped up from the voltage VPGMA by a predetermined voltage is applied. Regarding a verifying operation, a verifying operation targeted at an "A" level is started.

In the example of FIG. 27, voltages VPGMA, VPGMB, VPGMD, and VPGMF are applied only once. In this case, a magnitude relationship between the voltages VPGMA, VPGMB, VPGMD, and VPGMF is established like "VPGMA<VPGMB<VPGMD<VPGMF".

Meanwhile, the voltages VPGMA, VPGMB, VPGMD, and VPGMF are not limited to being applied only once, and may be applied a plurality of times to accomplish the objects thereof. Specifically, the voltages VGPMA, VPGMB, VPGMD, and VPGMF may be applied, for example, a plurality of times to thereby bring threshold voltages of memory cell transistors MT which are targets for writing close to voltages VA, VB, VD, and VF, respectively. In this case, a magnitude relationship between the voltages VPGMA, VPGMB, VPGMD, and VPGMF is not limited to "VPGMA<VPGMB<VPGMD<VPGMF", and may be any magnitude relationship.

2.1.3 With Regard to Operation of Latch Circuit

Next, the operation of a latch circuit in a write operation of the semiconductor memory device according to the second embodiment will be described. FIGS. 28 to 30 are tables illustrating the operation of a latch circuit in a write operation of the semiconductor memory device according to the second embodiment. FIGS. 28 to 30 illustrate pieces of data which are input to latch circuits SDL, ADL, BDL, and CDL connected to memory cell transistors MT respectively having target threshold voltage levels of an "Er" level to a "G" level.

First, the operation of a latch circuit in a first write operation will be described. FIG. 28 illustrates an example of a state where the input of lower data is completed and a state immediately after a programming operation for an "A" level in a first write operation is started.

As illustrated in FIG. 28, lower data is input to, for example, the latch circuit ADL. When the input of lower data is completed, the programming operation for an "A" level is started. Meanwhile, meaningful data is not input to the latch circuits BDL and CDL during the programming operation for an "A" level. In particular, middle data is in the course of being input to the latch circuit BDL, but the input of all pieces of data is not completed. For this reason, the latch circuits BDL and CDL do not contribute to the programming operation for an "A" level (denoted by NA in FIG. 28).

As described above, the programming operation for an "A" level is performed on memory cell transistors MT respectively having target threshold voltage levels of an "A" level to a "D" level, that is, a memory cell transistor MT having an apparent target threshold voltage level of an "A" level. Therefore, "0" indicating the execution of a programming operation is input to latch circuits SDLa, SDLb, SDLc, and SDLd, and "1" indicating that a programming operation is not executed is input to latch circuits SDLer, SDLe, SDLf, and SDLg.

Meanwhile, the input to the latch circuit SDL in the programming operation for an "A" level is realized, for example, by transmitting data which is input to the latch circuit ADL to the latch circuit SDL.

Next, the operation of a latch circuit in a second write operation will be described. FIG. 29 illustrates an example of a state where the input of middle data is completed and a state immediately after a programming operation for an "F" level or a programming operation for a "B" level in the second write operation is started.

As illustrated in FIG. 29, middle data is input to, for example, the latch circuit BDL. Meanwhile, upper data is in the course of being input to the latch circuit CDL during the second write operation, but the input of all pieces of data is not completed. For this reason, the latch circuit CDL does not contribute to the second write operation (denoted by NA in FIG. 29).

As described above, the programming operation for an "F" level is performed on memory cell transistors MT respectively having target threshold voltage levels of an "F" level and a "G" level, that is, a memory cell transistor MT having an apparent target threshold voltage level of an "F" level. Therefore, "0" is input to the latch circuits SDLf and SDLg, and "1" is input to the latch circuits SDLer to SDLe.

Meanwhile, the input to the latch circuit SDL in the programming operation for an "F" level is realized, for example, by transmitting the logical sum of inverted data of data which is input to the latch circuit ADL and data which is input to the latch circuit BDL, to the latch circuit SDL.

In addition, as described above, the programming operation for a "B" level is performed on memory cell transistors MT respectively having target threshold voltage levels of a "B" level and a "C" level, that is, a memory cell transistor MT having an apparent target threshold voltage level of a "B" level. Therefore, "0" is input to the latch circuits SDLb and SDLc, and "1" is input to the latch circuits SDLer, SDLa, and SDLd to SDLg.

Meanwhile, the input to the latch circuit SDL in the programming operation for a "B" level is realized, for example, by transmitting the logical sum of data which is input to the latch circuit ADL and data which is input to the latch circuit BDL, to the latch circuit SDL.

Next, the operation of a latch circuit in a third write operation will be described. FIG. 30 illustrates an example of a state where the input of upper data is completed and a state immediately after a programming operation for a "D" level in the third write operation is started.

As illustrated in FIG. 30, upper data is input to, for example, the latch circuit CDL.

As described above, the programming operation for a "D" level is performed on memory cell transistors MT respectively having target threshold voltage levels of a "D" level and an "E" level. Therefore, "0" is input to the latch circuits SDLd and SDLe, and "1" is input to the latch circuits SDLer to SDLc, SDLf, and SDLg.

Meanwhile, the input to the latch circuit SDL in the programming operation for a "D" level is realized, for example, by transmitting the logical sum of inverted data of data which is input to the latch circuit BDL and data which is input to the latch circuit CDL, to the latch circuit SDL.

2.2 Effects According to this Embodiment

It is desired that a time required for a write operation is reduced. For this reason, it is desired that an operation of increasing a threshold voltage of a memory cell transistor is performed with a smaller number of loops. On the other hand, when a threshold voltage is increased with a small number of loops, there is a possibility that the threshold voltage is increased to an unintended range. Since it is difficult to return the threshold voltage, which is once increased, to the original voltage during a write operation, it is desired that the write operation is performed with a smaller number of loops while avoiding an increase in the threshold voltage to an unintended range.

According to the second embodiment, in the first write operation, voltage VPGMA is applied to memory cell transistors MT respectively having target threshold voltage levels of an "A" level to a "D" level, as a write voltage. Since middle data and upper data are in a non-input state at a point in time when the first write operation is started, it is not yet decided which of an "A" level to a "D" level a target threshold voltage level indicates. However, since the fact that a target threshold voltage level is equal to or higher than at least an "A" level is known, the voltage VPGMA is applied to the memory cell transistors MT respectively having target threshold voltage levels of an "A" level to a "D" level. Thereby, it is possible to bring threshold voltages of the memory cell transistors MT respectively having target threshold voltage levels of an "A" level to a "D" level close to an "A" level, while preventing a threshold voltage of a memory cell transistor MT in which writing is required to be performed up to only an "A" level from increasing to a "B" level before the input of middle data is completed. For this reason, it is possible to perform writing with a smaller number of loops, when a normal write operation is performed on the memory cell transistors MT respectively having target threshold voltage levels of an "A" level to a "D" level after the input of all pieces of data is completed.

In addition, in the second write operation, voltage VPGMF is applied to memory cell transistors MT respectively having target threshold voltage levels of an "F" level and a "G" level, as a write voltage. Since upper data is in a non-input state at a point in time when the second write operation is started, it is not yet decided which of an "F" level and a "G" level a target threshold voltage level indicates. However, since the fact that a target threshold voltage level is equal to or higher than at least an "F" level is known, the voltage VPGMF is applied to the memory cell transistors MT respectively having target threshold voltage levels of an "F" level and a "G" level. Thereby, it is possible to bring threshold voltages of the memory cell transistors MT respectively having target threshold voltage levels of an "F" level and a "G" level close to an "F" level, while preventing a threshold voltage of a memory cell transistor MT in which writing is required to be performed up to only an "F" level from increasing to a "G" level before the input of upper data is completed. For this reason, it is possible to perform writing with a smaller number of loops, when a normal write operation is performed on the memory cell transistors MT respectively having target threshold voltage levels of an "F" level and a "G" level after the input of all pieces of data is completed.

In addition, in the second write operation, voltage VPGMB is applied to memory cell transistors MT respectively having target threshold voltage levels of a "B" level and a "C" level, as a write voltage. Since upper data is in a non-input state at a point in time when the second write operation is started, it is not yet decided which of a "B" level and a "C" level a target threshold voltage level indicates. However, since the fact that a target threshold voltage level is equal to or higher than at least a "B" level is known, the voltage VPGMB is applied to the memory cell transistors MT respectively having target threshold voltage levels of a "B" level and a "C" level. Thereby, it is possible to bring threshold voltages of the memory cell transistors MT respectively having target threshold voltage levels of a "B" level and a "C" level close to a "B" level, while preventing a threshold voltage of a memory cell transistor MT in which writing is required to be performed up to only a "B" level from increasing to a "C" level before the input of upper data is completed. For this reason, it is possible to perform writing with a smaller number of loops, when a normal write operation is performed on the memory cell transistors MT respectively having target threshold voltage levels of a "B" level and a "C" level after the input of all pieces of data is completed.

In addition, in the third write operation, voltage VPGMD is applied to memory cell transistors MT respectively having target threshold voltage levels of a "D" level and an "E" level, as a write voltage. Since the input of all pieces of data is completed at a point in time when the third write operation is started, a memory cell transistor MT having a target threshold voltage level of either a "D" level or an "E" level is decided. The voltage VPGMD is applied to the memory cell transistors MT respectively having target threshold voltage levels of a "D" level and an "E" level by using the decision of the memory cell transistor. Thereby, it is possible to bring threshold voltages of the memory cell transistors MT respectively having target threshold voltage levels of a "D" level and an "E" level close to a "D" level, while preventing a threshold voltage of a memory cell transistor MT in which writing is required to be performed up to only a "D" level from increasing to an "E" level before a normal write operation is started after the input of all pieces of data is completed. For this reason, it is possible to perform writing with a smaller number of loops, when a normal write operation is performed on the memory cell transistors MT respectively having target threshold voltage levels of a "D" level and an "E" level.

3. Third Embodiment

Next, a semiconductor memory device according to a third embodiment will be described. In the third embodiment, a verifying operation including a search operation is performed in a first loop, as a first write operation. Write voltages in the subsequent loops are determined based on results of the search operation. Hereinafter, the same components as those in the first embodiment will be denoted by the same reference numerals and signs, and a description thereof will not be repeated. Only portions different from the first embodiment will be described.

3.1 With Regard to Write Operation

A write operation of the semiconductor memory device according to the third embodiment will be described.

3.1.1 With Regard to Outline of Write Operation

An outline of a write operation according to the third embodiment will be simply described.

Figure 31:
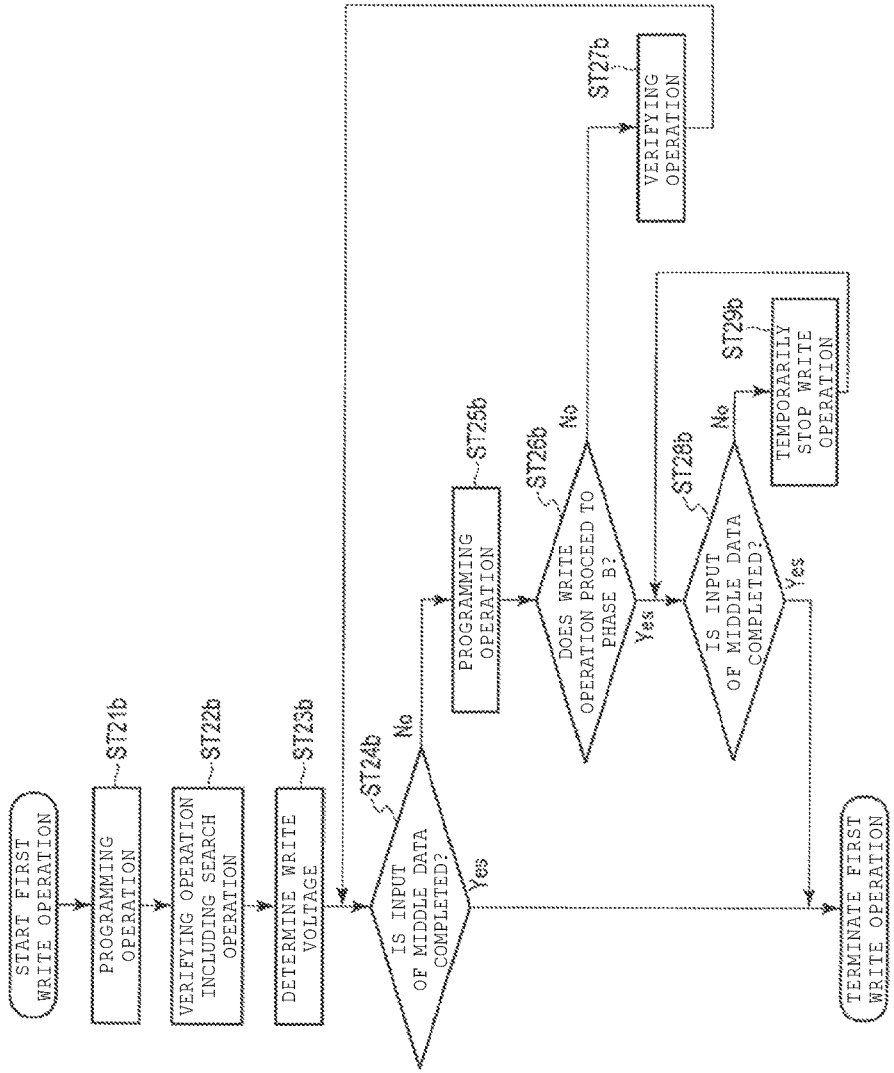
FIG. 31 is a flow chart illustrating a first write operation of a semiconductor memory device according to a third embodiment.

FIG. 31 is a flow chart illustrating a write operation of the semiconductor memory device according to the third embodiment. FIG. 31 illustrates a first write operation in the write operation according to the third embodiment. FIG. 31 is included as the first write operation in the entire operation of the write operation in FIG. 11 which is described in conjunction with the first embodiment, and corresponds to FIG. 12.

As illustrated in FIG. 31, in step ST21b, a sequencer 25 operates a programming operation.

In step ST22b, the sequencer 25 performs a verifying operation including a search operation.

In step ST23b, the sequencer 25 determines a write voltage to be applied to programming operations of the next loop and the subsequent loops based on results of the search operation.

Step ST24b to step ST29b are the same as step ST21 to step ST26 of FIG. 12 which is described in the first embodiment, and thus a description thereof will not be repeated. Thus, the first write operation is terminated.

Figure 32:
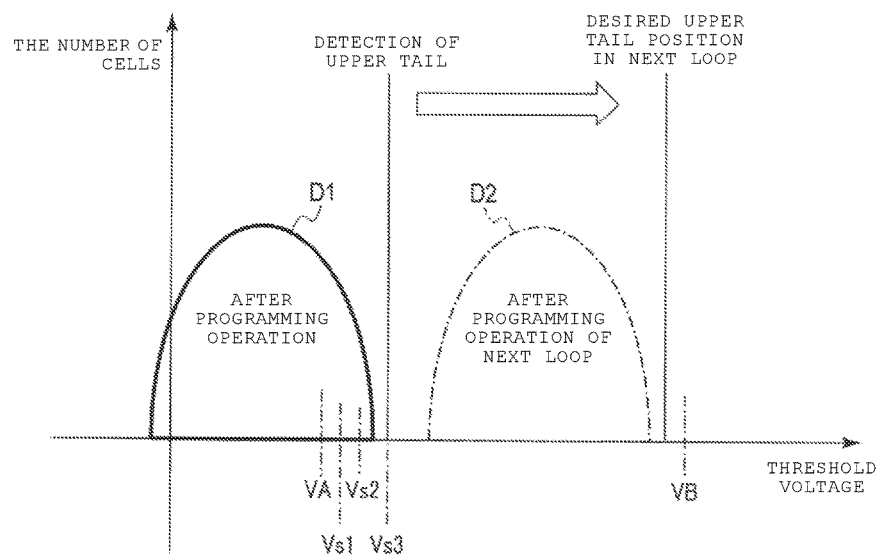
FIG. 32 is a schematic diagram illustrating a search write operation of the semiconductor memory device according to the third embodiment.

FIG. 32 is a schematic diagram illustrating the first write operation of the semiconductor memory device according to the third embodiment. FIG. 32 schematically illustrates the state of a threshold voltage in a search operation performed in the first write operation.

As illustrated in FIG. 32, the search operation is performed between programming operations of two consecutive loops. After a programming operation in a certain loop is performed, the distribution of threshold voltages of a plurality of memory cell transistors MT which are targets for writing is like, for example, a distribution D1. In the distribution D1, for example, a threshold voltage of a memory cell transistor MT which tends to increase exceeds voltage VA by a programming operation. In FIG. 32, it is assumed that the sequencer 25 plans to increase the distribution D1 to a threshold voltage which is larger than the voltage VA by a programming operation in the next loop. In the search operation, an upper tail of the distribution D1 is detected in such a case.

Specifically, for example, in the search operation, voltages Vs1, Vs2, and Vs3 are applied to a selected word line WL, similar to the voltage VA in the verifying operation. Thereby, a voltage (voltage Vs3 in the example of FIG. 32)

for setting a memory cell transistor MT to enter an on state in all memory cell transistors MT is detected as an upper tail (right end) of the distribution of threshold voltages.

After the upper tail of the distribution of threshold voltages is detected by a search operation, the sequencer 25 determines the value of a write voltage which is applied in a programming operation of the next loop, based on the value of the detected upper tail. Specifically, for example, the sequencer 25 holds a desired upper tail in the next loop.

Meanwhile, a case where the upper tail position of distribution of threshold voltages exceeds voltage VB by the programming operation of the next loop means that writing is performed up to a "B" level in a portion of a memory cell transistor MT in which an "A" level is to be originally written. For this reason, it is desired that the desired upper tail position is set, for example, to such an extent as not to exceed the voltage VB. In addition, when the upper tail position of distribution of threshold voltages does not sufficiently approach the voltage VB by the programming operation of the next loop, there is a possibility that the amount of increase in a threshold voltage of the entire distribution including a lower tail (left end) of the distribution is low. In this case, there is a possibility that the lower tail position of the distribution does not exceed the voltage VA, and there is a possibility that a verifying operation targeted at an "A" level is not passed. For this reason, regarding the desired upper tail position, it is desired that, for example, a value which is sufficiently based on the voltage VB is set.

The sequencer 25 determines a write voltage to be applied to the next loop, based on the value of a difference between the desired upper tail position and the present upper tail position. Thereby, a distribution D2 of threshold voltages of the memory cell transistor MT after the programming operation of the next loop may increase so as to sufficiently approach the voltage VB to such an extent that an upper tail does not exceed the voltage VB. For this reason, the sequencer 25 can increase the probability of a lower tail (left end) of the distribution D2 exceeding voltage VA to such an extent that the upper tail of the distribution D2 does not exceed the voltage VB.

3.1.2 With Regard to Timing Chart

Figure 33:
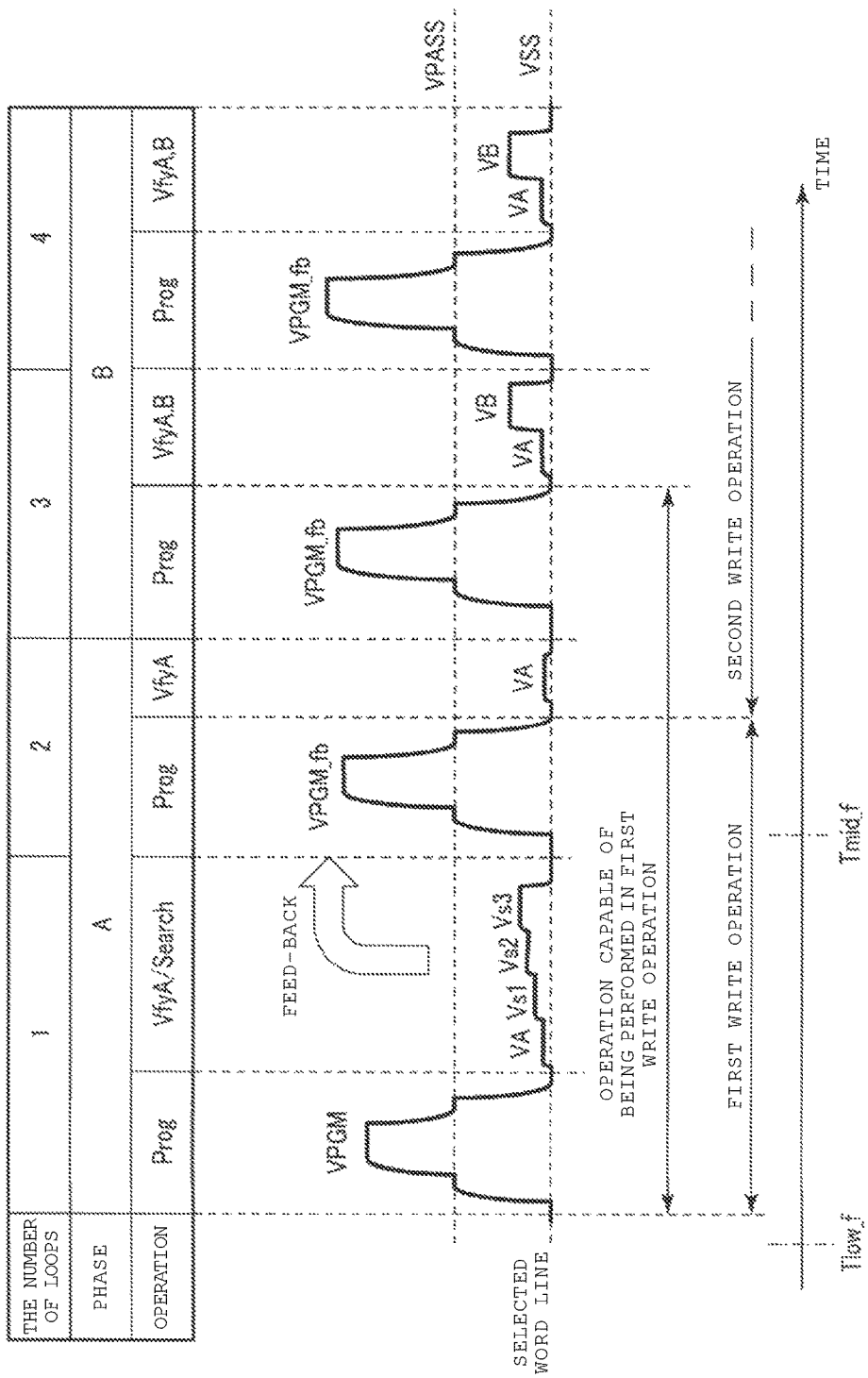
FIG. 33 is a timing chart illustrating a write operation of the semiconductor memory device according to the third embodiment.

Next, a timing chart in a write operation of the semiconductor memory device according to the third embodiment will be described with reference to FIG. 33. FIG. 33 is a timing chart illustrating a write operation of the semiconductor memory device according to the third embodiment. In FIG. 33, a timing chart in a first write operation is illustrated.

As illustrated in FIG. 33, when time Tlow_f elapses, a first write operation is started, and the following various types of voltages are applied to a selected word line WL as an example.

In a first loop, a programming operation, and a verifying operation including a search operation are performed. In the programming operation, voltage VPGM is applied to a selected word line WL after voltage VPASS is applied thereto. Thereafter, voltage VSS is applied to the selected word line WL after voltage VPASS is applied thereto, and the programming operation is terminated.

In the verifying operation including the search operation, voltage VA is applied to the selected word line WL. Subsequently, voltages Vs1, Vs2, and Vs3 are sequentially applied to the selected word line WL, as search voltages. Thereby, an upper tail of distribution of threshold voltages of memory cell transistors MT respectively having target threshold voltage levels of an "A" level to a "D" level is detected.

Thereafter, voltage VSS is applied to the selected word line WL, and thus the verifying operation including the search operation is terminated. For example, the voltages Vs1, Vs2, and Vs3 have values larger than the voltage VA and smaller than the voltage VB.

In a second loop, a programming operation, and a verifying operation targeted at an "A" level are performed. In the programming operation, voltage VPGM_fb is applied to the selected word line WL after voltage VPASS is applied thereto. Results of the search operation performed in the first loop are fed back to the voltage VPGM_fb. In other words, the voltage VPGM_fb has a value that may sufficiently approach voltage VB to such an extent that the upper tail of distribution of threshold voltages of memory cell transistors MT respectively having target threshold voltage levels of an "A" level to a "D" level does not exceed the voltage VB. Thereafter, voltage VSS is applied to the selected word line WL after voltage VPASS is applied thereto, and the programming operation is terminated.

In a third loop and the subsequent loops, the phase transitions to phase B, and a programming operation, a verifying operation targeted at an "A" level, and a verifying operation targeted at a "B" level are repeatedly performed. In the programming operation, voltage VPGM_fb is applied to the selected word line WL after voltage VPASS is applied thereto. Thereafter, after voltage VPASS is applied to the word line WL, voltage VSS is applied thereto, and the programming operation is terminated. Meanwhile, the voltage VPGM_fb is gradually stepped up as the number of loops increases.

Meanwhile, in the example of FIG. 33, time Tmid_f elapses during the programming operation in the second loop. In other words, the input of middle data is completed during the execution of an operation capable of being performed in the first write operation. In this manner, when the input of middle data is completed during the execution of an operation capable of being performed in the first write operation, the sequencer 25 can perform transition to a second write operation without temporarily stopping the first write operation.

3.2 Effects According to this Embodiment

A plurality of memory cell transistors provided in the semiconductor memory device are designed and generated so as to have the same performances. However, the performances of the plurality of memory cell transistors may vary due to manufacturing errors or the like. The performances include, for example, the amount of increase in a threshold voltage when a certain write voltage is applied. In other words, even when the same write voltage is applied, threshold voltages of the respective memory cell transistors may increase to different threshold voltages. For this reason, a write voltage is set to have a small value so as to prevent the generation of a memory cell transistor in which a threshold voltage increases to an unintended level or higher in a write operation due to such variations.

According to the third embodiment, a search operation is performed in a first write operation. Specifically, an upper tail of distribution of threshold voltages increasing by a programming operation is detected until the input of middle data is completed. Thereby, the sequencer 25 can detect to which degree a threshold voltage of a memory cell transistor MT, which tends to increase, increases by a write voltage applied in the programming operation. In other words, the sequencer 25 can detect a maximum value of the threshold voltage that increases by the write voltage.

In addition, the sequencer 25 determines whether it is desired to which degree a threshold voltage of the distribution increases in the next programming operation, based on the value of the detected upper tail of distribution of the threshold voltages. Specifically, it is desired that an upper tail of distribution of threshold voltages after the programming operation of the next loop is set to such an extent as not to exceed voltage VB, in order to prevent writing from being performed up to a "B" level in a memory cell transistor MT having a target threshold voltage level of an "A" level. In addition, it is desired that an upper tail of distribution of threshold voltages after the programming operation of the next loop is set to sufficiently approach voltage VB so that a memory cell transistor MT having a target threshold voltage level of an "A" level or higher passes a verifying operation targeted at an "A" level of the next loop by the programming operation of the next loop. The sequencer 25 determines the value of a write voltage to be applied in the programming operation of the next loop so that a threshold voltage in an upper tail of distribution increases up to an optimal position in order to satisfy the above-described conditions. Thereby, it is possible to apply an optimal write voltage in consideration of actual variations in the amount of increase in a threshold voltage.

4. Modification Example and the Like

Embodiments are not limited to the configurations described in the above-described first to third embodiments, and can be modified in various ways. In the semiconductor memory devices according to the above-described first to third embodiments, a case where a special set of commands is used during the execution of a first write operation, a second write operation, and a third write operation will be described, but the exemplary embodiment is not limited thereto. For example, a semiconductor memory device may previously receive a set feature command to thereby perform a write operation including a first write operation, a second write operation, and a third write operation when receiving a normal write command. In the following description, the same components as those in the first embodiment will be denoted by the same reference numerals and signs, and a description thereof will not be repeated. Only portions different from the first embodiment will be described.

Figure 34:
FIG. 34 is a timing chart illustrating a set feature operation of a semiconductor memory device according to a modification example.

FIG. 34 is an example of a command sequence illustrating a set feature operation of a write operation of a semiconductor memory device according to a modification example.

As illustrated in FIG. 34, a controller 10 issues a command "EFh" and transmits the issued command to a semiconductor memory device 20. The command "EFh" is a command for instructing the semiconductor memory device 20 to execute a set feature. For example, the set feature is an operation of changing parameters for specifying various types of operations of the semiconductor memory device 20. Subsequently, the controller 10 issues a command "ZZh", and transmits the issued command to the semiconductor memory device 20. The command "ZZh" is a command for instructing the setting of whether to make a write operation of the semiconductor memory device 20 include a first write operation, a second write operation, and a third write operation.

The controller 10 issues pieces of data B0 to B3, for example, over four cycles, and transmits the issued data to the semiconductor memory device 20. For example, the pieces of data B0 to B3 are data for setting whether to make a write operation include a first write operation, a second write operation, and a third write operation. Subsequently, a logic control circuit 23 sets a signal /RB to be at an "L" level to inform the controller 10 that the semiconductor memory device 20 is in a busy state. A period of time tFEAT for which the semiconductor memory device 20 is in a busy state indicates a period of time for which a set feature operation is performed. The setting of whether or not the first write operation, the second write operation, and the third write operation are included in the write operation during the period of time tFEAT is updated.

Thereafter, the write operation including the first write operation, the second write operation, and the third write operation is performed similar to the first embodiment. By the above-described operation, a write operation based on lower data is performed while the semiconductor memory device 20 inputs middle data. In addition, a write operation based on lower data and middle data is performed while the semiconductor memory device 20 inputs upper data. In addition, after the input of all pieces of data is completed, a write operation based on all of the pieces of data is performed.

FIG. 35 is a table illustrating an example of data for setting the presence or absence of a first write operation, a second write operation, and a third write operation in a set feature operation of the semiconductor memory device according to the modification example. As illustrated in FIG. 35, each of pieces of data B0 to B3 is, for example, data of eight bits, and includes write operation setting information for setting whether or not a write operation is started with only preceding input data. In other words, write operation setting information is held in the lowermost bit in the data B0. For example, the write operation setting information is set to "0" when writing is started after all pieces of data are input, and is set to "1" when writing is started with only preceding input data.

Meanwhile, in the example of FIG. 35, a first bit to a seventh bit of the data B0 and the pieces of data B1 to B3 are set to be in a non-application state, but other information may be included in these bits.

In this manner, a set feature command is received, and it is previously set whether to start a write operation before the input of all pieces of data is completed. Thereby, it is possible to start a write operation with only preceding input data even when a normal write command is received. For this reason, it is possible to start a write operation before the input of all pieces of data is completed, without changing a normal write operation and a command sequence. Therefore, it is possible to reduce burden on the controller 10.

In addition, the following matters can be applied in the embodiments.

In a read operation (reading) of a multi-value level, a voltage applied to a word line selected in a read operation of an A level is in a range of, for example, 0 V to 0.55 V. However, the voltage is not limited thereto, and may be set to be in any of ranges of 0.1 V to 0.24 V, 0.21 V to 0.31 V, 0.31 V to 0.4 V, 0.4 V to 0.5 V, and 0.5 V to 0.55 V.

A voltage applied to a word line selected in a read operation of a B level is in a range of, for example, 1.5 V to 2.3 V. However, the voltage is not limited thereto, and may be set to be in any of ranges of 1.75 V to 1.8 V, 1.8 V to 1.95 V, 1.95 V to 2.1 V, and 2.1 V to 2.3 V.

A voltage applied to a word line selected in a read operation of a C level is in a range of, for example, 3.0 V to 4.0 V. However, the voltage is not limited thereto, and may be set to be in any of ranges of 3.0 V to 3.2 V, 3.2 V to 3.4 V, 3.4 V to 3.5 V, 3.5 V to 3.7 V, and 3.7 V to 4.0 V.

A time (tR) of a read operation may be set to be in any of ranges of, for example, 25 μs to 38 μs, 38 μs to 70 μs, and 70 μs to 80 μs.

A write operation includes a programming operation and a verifying operation. In the write operation, a voltage which is first applied to a word line selected during the programming operation is in a range of, for example, 13.7 V to 14.3 V. The voltage is not limited thereto, and may be set to be in any of ranges of, for example, 13.7 V to 14.0 V, and 14.0 V to 14.7 V.

A voltage which is first applied to a selected word line during the writing of an odd-numbered word line and a voltage which is first applied to a selected word line during the writing of an even-numbered word line may be changed.

When the programming operation is performed based on an incremental step pulse program (ISPP) system, a voltage of, for example, approximately 0.5 V is used as a step-up voltage.

A voltage applied to a non-selected word line may be in a range of, for example, 7.0 V to 7.3 V. The voltage is not limited to this case, and may be in a range of, for example, 7.3 V to 8.4 V or may be set to equal to or less than 7.0 V.

A pass voltage applied depending on whether a non-selected word line is an odd-numbered word line or an even-numbered word line may be changed.

A time (tProg) of a write operation may be set to be in any of ranges, for example, 1700 μs to 1800 μs, 1800 μs to 1900 μs, and 1900 μs to 2000 μs.

In an erasing operation, a voltage which is first applied to a well, which is formed on a semiconductor substrate and has a memory cell disposed thereon is in a range of, for example, 12 V to 13.7 V. The voltage is not limited to this case, and may be in any of ranges of, for example, 13.7 V to 14.8 V, 14.8 V to 19.0 V, 19.0 V to 19.8 V, and 19.8 V to 21 V.

A time (tErase) of an erasing operation may be set to be in any of ranges of, for example, 3000 μs to 4000 μs, 4000 μs to 5000 μs, and 4000 μs to 9000 μs.

A memory cell includes a charge storage layer which is disposed on a semiconductor substrate (silicon substrate) through a tunnel insulating film having a film thickness of 4 nm to 10 nm. The charge storage layer may be configured as a stacked structure of an insulating film, formed of SiN or SiON to have a film thickness of 2 nm to 3 nm, and polysilicon having a film thickness of 3 nm to 8 nm. In addition, a metal such as Ru may be added to polysilicon. An insulating film is formed on the charge storage layer. For example, the insulating film is configured such that a silicon oxide film having a film thickness of 4 nm to 10 nm is interposed between a lower High-k film having a film thickness of 3 nm to 10 nm and an upper High-k film having a film thickness of 3 nm to 10 nm. The High-k film may be formed of HfO or the like. In addition, the film thickness of the silicon oxide film may be larger than the film thickness of the High-k film. A control electrode having a film thickness of 30 nm to 70 nm is formed on the insulating film through a material which has a film thickness of 3 nm to 10 nm. Here, such material is a metal oxide film such as TaO, or a metal nitride film such as TaN. A material of the control electrode may be W or the like.

In addition, an air gap can be formed between memory cells.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a word line;
a plurality of memory cells electrically connected to the word line; and
a control circuit configured to perform a multi-bit write operation on the memory cells to increase threshold voltage of the memory cells to one of multiple target levels including a first target level that corresponds to a first bit pattern, a second target level that is higher than the first target level and corresponds to a second bit pattern, and a third target level that is higher than the second target level and corresponds to a third bit pattern, wherein the control circuit performs the multi-bit write operation on the memory cells in response to a plurality of command sets respectively corresponding to bit levels of the multi-bit write operation, the command sets including a first command set and a second command set subsequent thereto, the first command set including a first command and first data corresponding to one of the bit levels, and the second command set including a second command and second data corresponding to another one of the bit levels, wherein
the multi-bit write operation includes at least
 a first write operation including a first program operation performed on at least one of the memory cells with the first data and then a first verify operation to verify that the threshold voltage of the at least one of the memory cells has increased to at least the first target level, the first write operation being initiated after receipt of the first command set and performed during receipt of the second command set, and
 a second write operation including a second program operation performed on the at least one of the memory cells with the second data and then a second verify operation to verify that the threshold voltage of the at least one of the memory cells has increased to at least the second target level, the second write operation being initiated after receipt of the second command set has completed.

2. The device according to claim 1, wherein
the command sets further include a third command set, which is subsequent to the second command set, the third command set including a third command and third data corresponding to another one of the bit levels, and
the second write operation is performed during receipt of the third command set.

3. The device according to claim 2, wherein
the multi-bit write operation includes a third write operation including a third program operation performed on the at least one of the memory cells with the third data and then a third verify operation to verify that the threshold voltage of the at least one of the memory cells has increased to at least the third target level, the third write operation being initiated after receipt of the third command set has completed.

4. The device according to claim 3, wherein first, second, and third pages of data are written in the memory cells, the first data making up the first page of data, the second data making up the second page of data, and the third data making up the third page of data.

5. The device according to claim 1, wherein
the first write operation is terminated in response to receipt of the second data, and
until receipt of the second data, the control circuit executes one or more loops of a first program-verify operation including the first program operation and the first verify operation, the first program operation being repeatedly performed until the first verify operation confirms that the first program operation passed or a maximum number of loops has been reached.

6. The device according to claim 5, wherein after the first verify operation confirms that the first program operation has passed, if the second data has not yet been received, the control circuit executes the second program operation and then waits for the receipt of the second data, and in the second write operation, the control circuit executes a second verify operation if the second program operation has been performed in the first write operation.

7. The device according to claim 5, wherein the first write operation includes a search operation during which the control circuit determines an adjustment to a program voltage to be applied during the first program operation.

8. The device according to claim 1, wherein the first write operation includes the first program operation for raising a threshold voltage of first memory cells, included in the at least one of the memory cells, to be at least at the first target level, and after the first program operation, the control circuit determines whether or not the second data has been received and terminates the first write operation if the second data has been received.

9. The device according to claim 8, wherein the second write operation includes the second program operation for raising a threshold voltage of second memory cells, included in the at least one of the memory cells, to be at least at the second target level, and after the second program operation, the control circuit determines whether or not the third data has been received and terminates the second write operation if the third data has been received.

10. The device according to claim 9, wherein the third write operation includes a third program operation for raising a threshold voltage of third memory cells, included in the at least one of the memory cells, to be at least the third target level.

11. A method of performing a multi-bit write operation on a plurality of memory cells of a semiconductor memory device electrically connected to a word line, to increase threshold voltage of the memory cells to one of multiple target levels including a first target level that corresponds to a first bit pattern, a second target level that is higher than the first target level and corresponds to a second bit pattern, and a third target level that is higher than the second target level and corresponds to a third bit pattern, wherein the multi-bit write operation is performed on the memory cells in response to a plurality of command sets respectively corresponding to bit levels of the multi-bit write operation, said method comprising:

in response a first command set that includes a first command and first data corresponding to one of the bit levels, initiating a first write operation that includes a first program operation performed on at least one of the memory cells with the first data and a first verify operation to verify that the threshold voltage of the at least one of the memory cells has increased to at least the first target level;

after the first write operation has been initiated and while the first write operation is being performed, receiving a second command set that includes a second command and second data corresponding to another one of the bit levels; and when receipt of the second command set has completed, terminating the first write operation and initiating a second write operation that includes a second program operation performed on the at least one of the memory cells with the second data and a second verify operation to verify that the threshold voltage of the at least one of the memory cells has increased to at least the second target level.

12. The method according to claim 11, further comprising:

after the second write operation has been initiated and while the second write operation is being performed, receiving a third command set that includes a third command and third data corresponding to another one of the bit levels; and when receipt of the third command set has completed, terminating the second write operation and initiating a third write operation that includes a third program operation performed on the at least one of the memory cells with the third data and a third verify operation to verify that the threshold voltage of the at least one of the memory cells has increased to at least the third target level.

13. The method according to claim 12, wherein first, second, and third pages of data are written in the memory cells, the first data making up the first page of data, the second data making up the second page of data, and the third data making up the third page of data.

14. The method according to claim 11, wherein the first write operation comprises:

until receipt of the second data, executing one or more loops of a first program-verify operation including the first program operation and the first verify operation, the first program operation being repeatedly performed until the first verify operation confirms that the first program operation passed or a maximum number of loops has been reached.

15. The method according to claim 14, wherein the first write operation comprises:

after the first verify operation confirms that the first program operation has passed, if the second data has not yet been received, executing the second program operation and then waiting for the receipt of the second data.

16. The method according to claim 11, wherein the first write operation includes the first program operation for raising a threshold voltage of first memory cells, included in the at least one of the memory cells, to be at least at the first target level.

17. The method according to claim 16, wherein the second write operation includes the second program operation for raising a threshold voltage of second memory cells, included in the at least one of the memory cells, to be at least at the second target level.

18. The device according to claim 1, wherein each of the memory cells is capable of being programmed to have a threshold voltage of any one of seven target levels including the first, second, and third target levels.

19. The method according to claim 11, wherein each of the memory cells is capable of being programmed to have a threshold voltage of any one of seven target levels including the first, second, and third target levels.

* * * * *